(12) United States Patent
Hara et al.

(10) Patent No.: US 7,443,585 B2
(45) Date of Patent: Oct. 28, 2008

(54) POLARIZER, POLARIZATION LIGHT SOURCE AND IMAGE DISPLAY UNIT USING THEM

(75) Inventors: Kazutaka Hara, Ibaraki (JP); Minoru Miyatake, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 300 days.

(21) Appl. No.: 10/509,700

(22) PCT Filed: Apr. 17, 2003

(86) PCT No.: PCT/JP03/04872

§ 371 (c)(1),
(2), (4) Date: Sep. 30, 2004

(87) PCT Pub. No.: WO03/091766

PCT Pub. Date: Nov. 6, 2003

(65) Prior Publication Data

US 2005/0151896 A1    Jul. 14, 2005

(30) Foreign Application Priority Data

Apr. 23, 2002  (JP)  ............................. 2002-121129
Apr. 30, 2002  (JP)  ............................. 2002-128904

(51) Int. Cl.
*G02B 5/30* (2006.01)
*G02F 1/1335* (2006.01)

(52) U.S. Cl. ........................ 359/497; 359/500; 359/501; 349/18; 349/98; 349/181

(58) Field of Classification Search ................. 359/250, 359/253, 256, 278, 490, 494, 497, 500, 501; 349/18, 87, 98, 99, 117, 119, 120, 121, 122, 349/168, 175, 177, 181, 184, 186, 194

See application file for complete search history.

(56) References Cited

U.S. PATENT DOCUMENTS 3,940,203 A    2/1976  La Russa (Continued)

FOREIGN PATENT DOCUMENTS

DE    3836955    5/1990

(Continued)

OTHER PUBLICATIONS

W.A. Schurcliff"Polarized Light: Production and Use", Havard University Press, Cambridge, Mass., 1965(Japanese ed.), pp. 136, with partial English translation.

(Continued)

*Primary Examiner*—Ricky D Shafer
(74) *Attorney, Agent, or Firm*—Westerman, Hattori, Daniels & Adrian, LLP.

(57) ABSTRACT

A polarization component, capable of efficiently reflecting an obliquely transmitted light beam toward a light source without degrading the transmission-polarization property of a perpendicular incident light beam, is provided. A C-plate having an oblique retardation of at least λ/8 with respect to a light beam inclined by at least 30° is disposed between at least two reflective circular polarizer layers whose selective reflection wavelength bands of polarized light overlapping each other. A combination of a reflective linear polarizer and a quarter wavelength plate may be used instead of the reflective circular polarizer. Alternatively, a combination of two reflective linear polarizer layers and two quarter wavelength plate layers (Nz≧2) disposed therebetween can provide a similar effect. Further, a combination of two reflective linear polarizer layers and a half wavelength plate (Nz≧1.5) disposed therebetween may be used.

12 Claims, 10 Drawing Sheets

U.S. PATENT DOCUMENTS

| | | | |
|---|---|---|---|
| 4,388,453 A | 6/1983 | Finkelmann et al. | 528/15 |
| 4,984,872 A | 1/1991 | Vick | 350/321 |
| 5,089,883 A | 2/1992 | Welker et al. | 358/60 |
| 5,211,877 A | 5/1993 | Andrejewski et al. | 252/299.01 |
| 5,235,443 A | 8/1993 | Barnik et al. | 359/37 |
| 5,541,745 A * | 7/1996 | Fergason | 349/194 |
| 5,548,422 A * | 8/1996 | Conner et al. | 349/98 |
| 5,560,864 A | 10/1996 | Goulding | 252/299.01 |
| 5,580,950 A | 12/1996 | Harris et al. | 528/350 |
| 5,580,964 A | 12/1996 | Berneth et al. | 534/607 |
| 5,627,666 A * | 5/1997 | Sharp et al. | 349/74 |
| 5,721,603 A | 2/1998 | De Vaan et al. | 349/194 |
| 5,833,880 A | 11/1998 | Siemensmeyer et al. | 252/299.64 |
| 5,928,801 A | 7/1999 | Broer et al. | 428/690 |
| 6,078,421 A | 6/2000 | Davey et al. | 359/237 |
| 6,141,069 A * | 10/2000 | Sharp et al. | 349/98 |
| 6,217,955 B1 * | 4/2001 | Coates et al. | 428/1.31 |
| 6,291,035 B1 * | 9/2001 | Verrall et al. | 428/1.3 |
| 6,307,604 B1 | 10/2001 | Hikmet et al. | 349/71 |
| 6,344,887 B1 * | 2/2002 | Ma et al. | 349/98 |
| 6,549,335 B1 * | 4/2003 | Trapani et al. | 359/490 |
| 6,630,974 B2 * | 10/2003 | Galabova et al. | 349/119 |
| 6,773,766 B2 | 8/2004 | Meyer et al. | 428/1.1 |
| 6,822,710 B1 | 11/2004 | Son et al. | |
| 6,822,711 B1 | 11/2004 | Yoshida et al. | |
| 2001/0003473 A1 | 6/2001 | Galabova et al. | |
| 2002/0034009 A1 | 3/2002 | Broer et al. | 359/497 |
| 2002/0036735 A1 | 3/2002 | Arakawa et al. | 349/115 |
| 2005/0088740 A1 * | 4/2005 | Takeda et al. | 359/489 |
| 2005/0180017 A1 * | 8/2005 | Hara et al. | 359/619 |
| 2005/0200776 A1 * | 9/2005 | Hara et al. | 349/98 |
| 2007/0008460 A1 * | 1/2007 | Takeda et al. | 349/98 |

FOREIGN PATENT DOCUMENTS

| | | |
|---|---|---|
| DE | 4220289 | 12/1993 |
| DE | 19504224 | 8/1995 |
| DE | 4408171 | 9/1995 |
| EP | 066137 | 12/1982 |
| EP | 0261712 | 3/1988 |
| EP | 0358208 | 3/1990 |
| EP | 0 415 735 A2 | 3/1991 |
| EP | 0578302 | 1/1994 |
| EP | 0834754 | 4/1998 |
| EP | 1 008 886 A1 | 6/2000 |
| EP | 1160591 | 12/2001 |
| GB | 2280445 | 2/1995 |
| JP | 2-158289 | 6/1990 |
| JP | 3-45906 | 2/1991 |
| JP | 6-82777 | 3/1994 |
| JP | 6-235900 | 8/1994 |
| JP | 6-324333 | 11/1994 |
| JP | 7-36032 | 2/1995 |
| JP | 10-54909 | 2/1998 |
| JP | 10-510671 | 10/1998 |
| JP | 10-321025 | 12/1998 |
| JP | 10-321025 A | 12/1998 |
| JP | H11-3608 | 1/1999 |
| JP | 2001-166294 A | 6/2001 |
| JP | 2001-264535 A | 9/2001 |
| JP | 2001-516066 | 9/2001 |
| JP | 2001-330731 A | 11/2001 |
| JP | 2001-521643 | 11/2001 |
| JP | 2001-343529 | 12/2001 |
| JP | 2002-55232 A | 2/2002 |
| JP | 2002-90535 A | 3/2002 |
| JP | 2002-533742 | 10/2002 |
| JP | 2002-341343 | 11/2002 |
| KR | 2001-0026728 A | 4/2001 |
| WO | WO 93/22397 | 11/1993 |
| WO | WO 98/00428 | 1/1998 |
| WO | WO 99/09452 | 2/1999 |
| WO | WO 00/37585 | 6/2000 |
| WO | WO 00/39631 | 7/2000 |
| WO | WO 01/37007 | 5/2001 |
| WO | WO 02/25687 | 3/2002 |

OTHER PUBLICATIONS

"Dictionary of Liquid Crystal" edited by Liquid Crystal Section at Japan Society for the Promotion of Science, published by Baifukan Co., Ltd., 1989, pp. 65, with partial English translation.

Supplementary Partial Search Report of Corresponding European Patent Application No. 03717612.0 mailed Apr. 23, 2007.

Supplementary Search Report of Corresponding European Patent Application No. 03717612.0 mailed Jun. 29, 2007.

* cited by examiner

ABSTRACT

POLARIZER, POLARIZATION LIGHT SOURCE AND IMAGE DISPLAY UNIT USING THEM

TECHNICAL FIELD

The present invention relates to a polarization component. More specifically, the present invention relates to a polarization component that has excellent efficiency in use of diffuse light emitted from a light source, and that is used suitably for a high-brightness polarization light source and various image display apparatuses such as a highly-visible liquid crystal display apparatus, an organic EL display apparatus, PDP, and CRT.

BACKGROUND ART

For the purpose of improving visibility or the like of an image display apparatus, a technique of focusing light beams emitted from a light source toward a front direction so as to enhance the brightness has been used in general. More specifically, for example, a lens, a mirror (reflective layer) a prism or the like is used for utilizing refraction and reflection for focusing and parallelizing light beams, thereby enhancing the brightness.

For example, in a liquid crystal display apparatus, a light beam emitted from a light source is focused in a front direction by a prism sheet or the like so as to make the light beam enter a liquid crystal display apparatus efficiently to enhance the brightness. However, since a large refractive index difference is required in principle when focusing by means of a prism sheet, the prism sheet must be disposed via an air layer or the like. This may result in an optical loss caused by unnecessary reflection or scattering. Another problem is that a large number of parts will be required.

For another technique of enhancing emission brightness in polarization, a brightness enhancement system that uses retro-reflection has been proposed. Specifically, this brightness enhancement system includes disposing a reflective layer on a bottom surface of a light-guiding plate and disposing a reflective polarizer on the light-emitting surface. A light beam entering the system is separated into transmitted light and reflected light depending on its polarization state, and the reflected light is reflected via a reflective layer on the bottom surface of the light-guiding plate and re-emitted from the emission surface so as to enhance the brightness. For example, reflection and separation of circularly polarized light by a cholesteric liquid crystal is detailed in, for example, JP 03(1991)-45906 A, JP 06(1994)-324333 A, and JP 07(1995)-36032 A. However, such a brightness enhancement system cannot provide sufficient effects with respect to a light source whose focusing property is improved previously by using a prism sheet or the like, in comparison to a case where it is applied to a light source having a strong diffusivity.

For solving the above-described problems, techniques for enhancing brightness have been studied for parallelizing light beams from a light source by using a special optical film instead of a lens, a mirror, a prism or the like. A representative example is a method of using a combination of a line spectrum light source and a bandpass filter. More specific examples includes a method of disposing a bandpass filter on a line-luminescent light source such as a CRT or electroluminescence or a display apparatus, as described in applications or issued patents of Philips, for example, JP 06 (1994)-235900 A, JP 02(1990)-158289 A, Tokuhyo 10(1998)-510671 A (published Japanese translation of PCT international publication for patent application), U.S. Pat. No. 6,307,604, DE3836955, DE4220289, EP578302, U.S.2002-0034009, WO002/25687, or JP2001-521643 and JP2001-516066. Another example of a technique as described in U.S.2002-0036735 (Fuji Photo FilmCo., Ltd.) includes disposing a bandpass filter corresponding to three wavelengths, with respect to a line spectrum type cold cathode ray tube. However, these techniques have disadvantages that they will not function to the light sources without a line spectrum, or they have problems in designing and manufacturing films that selectively function with respect to a specific wavelength. Furthermore, an evaporated interference film is often used for the bandpass filter, but it has disadvantages, for example, that the wavelength properties may change under a humidified atmosphere, due to a change in the refractive index of the thin films.

Examples of a light-parallelizing system that uses a hologram-based material include a system described in U.S. Pat. No. 4,984,872 A1 (Rockwell International Corporation). However, the material has a high front transmittance while its reflection-elimination rate for oblique incident light beams is not so high. When a parallel light beam is provided to this system for a calculation of the straight transmittance, the transmittance in the front direction will be measured high since the light passes through in the front direction, while an oblique incident light beam will be scattered so that measurement value for the transmittance will be low.

However, the difference will not occur on a diffusion light source. Therefore, for a case of disposing the system on a diffusion backlight light source in use, it cannot exhibit necessarily its focusing function sufficiently. Moreover, the hologram-based material has problems in its physical properties such as durability, reliability or the like.

DISCLOSURE OF INVENTION

Therefore, it is an object of the present invention to provide a polarization component that can reflect obliquely-transmitted light toward a light source efficiently without degrading a transmission-polarization property of perpendicular incident light.

For solving the above-mentioned problems, a polarization component of the present invention includes, at least, two reflective polarizer layers and a retardation layer disposed between the reflective polarizer layers, where the two reflection polarizer layers are reflective circular polarizer layers that selectively transmit one of clockwise circularly polarized light or counterclockwise circularly polarized light while selectively reflect the other, and wherein the two reflective circular polarizer layers have selective reflection wavelength bands for selective reflection of polarized light, the bands overlapping each other at least partially, and the retardation layer satisfies conditions of the Formulae (I) and (II) below.

$$R \leq (\lambda/10) \quad (I)$$

$$R' \geq (\lambda/8) \quad (II)$$

wherein in Formulae (I) and (II), λ denotes a wavelength of light entering the retardation layer;

R denotes an absolute value of retardation (in-plane retardation) between a X-axis direction and a Y-axis direction with respect to incident light from a Z-axis direction (normal direction), where the X-axis direction is a direction showing a maximum refractive index within the plane of the retardation layer (in-plane slow axis direction), the Y-axis direction is a direction perpendicular to the X-axis direction within the plane of the retardation layer (in-plane fast axis direction), and the Z-axis direction is a thickness direction of the retardation layer and perpendicular to the X-axis direction and the Y-axis direction;

R' denotes an absolute value of retardation between a X'-axis direction and a Y'-axis direction with respect to incident light from a direction inclined by at least 30° with respect to the Z-axis direction, where the X'-axis direction is an axial direction within a plane of the retardation layer perpendicular to the incidence direction of the incident light inclined by at least 30° with respect to the Z-axis direction, and the Y'-axis direction is a direction perpendicular to the incidence direction and to the X'-axis direction.

BRIEF DESCRIPTION OF DRAWINGS

In FIG. 18, 2001 denotes a reflective circular polarizer, 2002 denotes a retardation layer, 2003 denotes a reflective circular polarizer, and 2004 denotes a quarter wavelength plate.

In FIG. 19, 2001 denotes a reflective circular polarizer, 2002 denotes a retardation layer, 2003 denotes a reflective circular polarizer, 2004 denotes a quarter wavelength plate, and 2005 denotes an absorptive dichroic polarizing plate.

BEST MODE FOR CARRYING OUT THE INVENTION

Figure 1:
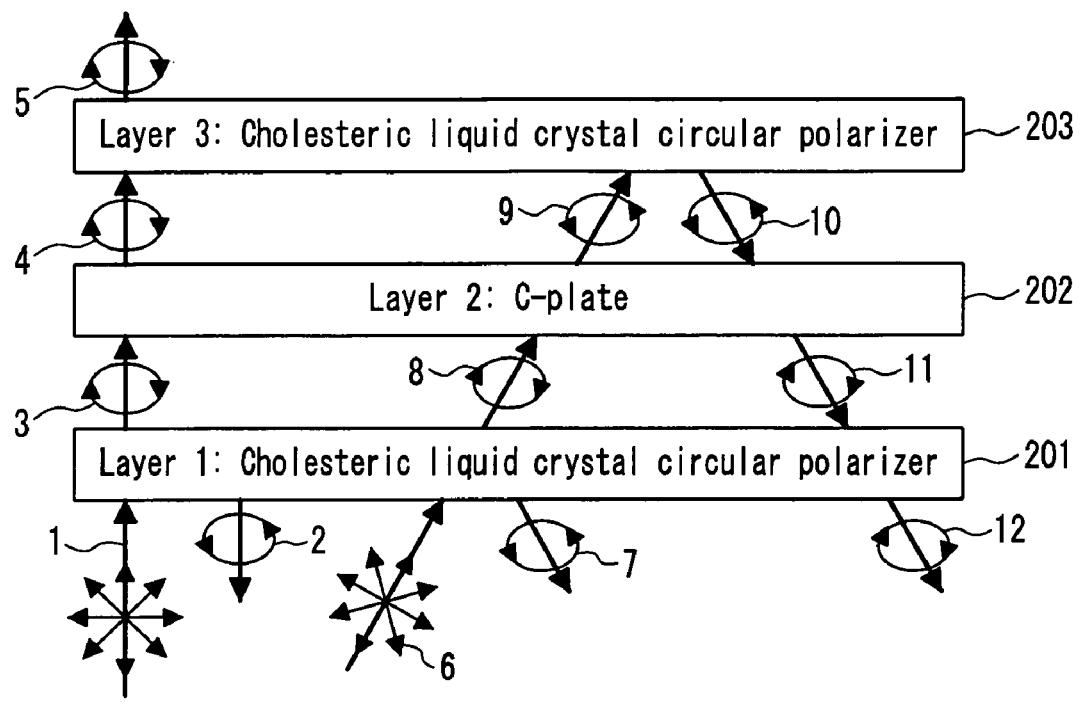
FIG. 1 shows a mechanism of simultaneous expression of focusing and brightness enhancement in one embodiment of a polarization component of the present invention, where a reflective circular polarizer and a C-plate are combined.

Next, embodiments of the present invention will be described below.

As a result of keen studies, the inventors have found that a polarization component of the present invention, having the above-described configuration, realizes efficient reflection of obliquely transmitted light toward a light source without degrading the transmission-polarization property of perpendicular incident light that contributes to front brightness. It is also possible to further enhance the brightness by converting the obliquely-transmitted light (reflective polarization) reflected toward the light source into a light beam that can contribute to enhancement of the front brightness. Furthermore, since a polarization component of the present invention is provided with brightness-enhancing function due to focusing and retro-reflection, it is less dependent on types of the light source regarding the focusing function and light-parallelizing function.

In a retardation layer of the present invention, the in-plane retardation R is not more than ($\lambda/10$) as described above, preferably it should be reduced as much as possible from aspects of retaining the polarization state of the incident light from the Z-axis direction (normal direction), preferably, $\lambda/20$ or less, more preferably, $\lambda/50$ or less, and ideally zero. Such a retardation layer that has no or extremely small in-plane retardation and has retardation only in the thickness direction is called a C-plate in which an optical axis is present in a thickness direction perpendicular to the in-plane direction. The C-plate is called a positive C-plate when its optical property condition satisfies the following Formula (VI), and it is called a negative C-plate when its optical property condition satisfies the following Formula (VII). Examples of typical negative C-plates include films of biaxially-stretched polycarbonate (PC) and polyethylene terephthalate (PET), a film of a cholesteric liquid crystal having a selective reflection wavelength band set to be shorter than that of visible light, a film having a discotic liquid crystal aligned in parallel with respect to the plane, and a product that can be obtained by in-plane alignment of an inorganic crystal compound having a negative retardation. Examples of typical positive C-plates include a perpendicularly-aligned liquid crystal film.

$$nx \approx ny < nz \qquad \text{(VI)}$$

$$nx \approx ny > nz \qquad \text{(VII)}$$

In the present invention, nx, ny and nz denote refractive indices in directions of a X-axis, a Y-axis, and a Z-axis in every optical layer such as the above-mentioned C-plate. The X-axis direction is a direction showing a maximum refractive index within the plane of the layer (in-plane slow axis direction), the Y-axis direction is a direction perpendicular to the X-axis direction within the plane of the layer (in-plane fast axis direction), and the Z-axis direction is a thickness direction of the layer and perpendicular to the X-axis direction and to the Y-axis direction.

The retardation layer in the present invention is not limited particularly as long as it satisfies the optical property conditions of Formulae (I) and (II). Preferably for example, the retardation layer includes a cholesteric liquid crystal compound fixed in a planar alignment state, and has a selective reflection wavelength band present in a wavelength region other than a visible light region (380 nm to 780 nm). Here, the selective reflection wavelength band is set to be a wavelength region other than a visible light region (380 nm to 780 nm) in order to avoid coloration or the like in the visible light region. The selective reflection wavelength band of the cholesteric liquid crystal layer can be determined unequivocally on the basis of a cholesteric chiral pitch and a refractive index of the liquid crystal, and a central wavelength λ of the selective reflection can be represented by the following Formula (VIII).

$$\lambda = np \quad \text{(VIII)}$$

In Formula (VIII), n denotes an average refractive index of cholesteric liquid crystal molecules, and p denotes a chiral pitch.

The value of the central wavelength of the selective reflection wavelength band can be present in a region of a wavelength longer than that of visible light, e.g., it can be present in a near infrared radiation region. However, it is more preferable that the value is present in a ultraviolet region of not more than 350 nm, since any complicated phenomenon may not occur there substantially under influences or the like of optical rotation.

Though the kind of the cholesteric liquid crystal is not limited particularly and can be selected suitably, examples thereof include a polymeric liquid crystal obtained by polymerizing liquid crystal monomers, a liquid crystal polymer exhibiting a cholesteric liquid crystal property at a high temperature, and a mixture thereof Though the cholesteric liquid crystal property can be either lyotropic or thermotropic, a thermotropic liquid crystal is preferred from aspects of easy control and easy formation of monodomain. Similarly, the method of producing the cholesteric liquid crystal is not limited particularly, but any known methods can be used suitably. Materials that can be used for producing a partially-crosslinked polymer material having a cholesteric liquid crystal property are not limited particularly. Arbitrary examples include materials as described in Tokuhyo 2002-533742 (WO00/37585), EP358208 (U.S. Pat. No. 5,211,877), and EP66137 (U.S. Pat. No. 4,388,453). The cholesteric liquid crystal can be obtained also by, for example, mixing and reacting a nematic liquid crystal monomer or a polymerizable mesogenic compound with a chiral agent. The polymerizable mesogenic compound is not particularly limited but the examples can be those disclosed in WO93/22397, EP0261712, DE19504224, DE4408171 and GB2280445. Non-chiral compounds or chiral compounds can be used, and the compounds can be mono-, di-, or multi-reactive, which can be synthesized in a known manner. Specific examples of the polymerizable mesogenic compounds include trade name LC242 (produced by BASF AG), trade name E7 (produced by Merck Ltd.) and trade name LC-Sillicon-CC3767 (produced by Wacker-Chemie GmbH). The chiral agent is not particularly limited either, but can be synthesized by a method described in WO 98/00428, for example. More specifically, non-polymerizable chiral compounds such as trade name S101, trade name R811, trade name CB15 (produced by Merck Ltd.) or a chiral agent such as trade name LC756 (produced by BASF AG) can be used.

The method for producing the retardation layer containing the cholesteric liquid crystal compound is not particularly limited, but a conventionally known method for producing a cholesteric liquid crystal layer can be used suitably. An example thereof includes coating a cholesteric liquid crystal compound on a base having an alignment film on the surface or a base having by itself a liquid crystal alignment capability, aligning the compound and fixing the alignment state.

The base can be, for example, an alignment layer obtained by forming a film of polyimide polyvinyl alcohol, polyester, polyarylate, polyamide imide, polyetherimide or the like on a base having a birefringence retardation as small as possible such as triacetylcellulose or amorphous polyolefin, and rubbing the surface of this film with a rayon cloth or the like, or an alignment layer obtained by forming an obliquely deposited layer of $SiO_2$ on a similar base. Other examples include a base provided with a liquid crystal alignment capability by stretching a polyethylene terephthalate (PET) film or a polyethylene naphthalate (PEN) film, a base provided with a fine roughness having a fine alignment-controlling force by further treating the surface of the stretched film with abrasives such as colcothar or a rubbing cloth, or a base obtained by forming an alignment layer that generates an alignment controlling force by light irradiation, such as azobenzene compounds, on the stretched film.

A specific method of forming a retardation layer containing a cholesteric liquid crystal compound on the base is as follows. First, a solution of a liquid crystal polymer is coated on a surface of the base having a liquid crystal alignment capability, and dried for forming a liquid crystal layer. There is no particular limitation about the solvent, and examples thereof includes chlorinated solvents such as methylene chloride, trichloroethylene and tetrachloroethane, ketone-based solvents such as acetone, methyl ethyl ketone (MEK) and cyclohexanone, aromatic solvents such as toluene, cyclic alkanes such as cycloheptane, amide-based solvents such as N-methylpyrrolidone, and ether-based solvents such as tetrahydrofuran. They may be used alone or in combination. Moreover, the coating method is not limited either but can be a conventionally known method such as spin coating, roller coating, flow coating, printing, dip coating, film flow-expanding, bar coating or gravure printing. In an alternatively applicable method, a heat-molten product of a liquid crystal polymer, preferably a heat-molten product in a state exhibiting an isotropic phase is coated in a similar manner in place of the above-mentioned solution, which is then expanded to form a thinner layer and fixed while keeping the melt temperature as required. Such a method is advantageous in good hygiene in the working condition, as no solvent is used.

Then, the alignment state of the cholesteric liquid crystal molecules in the liquid crystal layer is fixed to obtain a desired retardation layer. The fixing method is not limited particularly, but any suitable methods can be selected corresponding to the objectives of the invention. For example, the liquid crystal layer is heated to a temperature of at least a glass transition point and lower than an isotropic phase transition point so as to cause a planar alignment of the liquid crystal polymer molecules, and then cooled down to the temperature lower than the glass transition point so as to form a glassy state, thereby fixing the alignment. Alternatively, the alignment also may be fixed by an irradiation of energy such as ultraviolet rays or ion beams in a stage where the alignment state is formed. In the above process, it is also possible to use a liquid crystal monomer in place of or together with the liquid crystal polymer, which is aligned and polymerized by ionizing radiation such as an electron beam and ultraviolet ray or heat so as to provide a polymeric liquid crystal. At this time, it is possible to add a chiral agent or an alignment auxiliary as required.

The base, when having a small birefringence for example, can be integrated with a retardation layer containing the cholesteric liquid crystal compound in use for a polarization component. In a case, for example, where the thickness or the birefringence of the base may inhibit the functions of the polarization component, the retardation layer can be peeled off from the base or can be transferred to another base in use.

For the retardation layer, a retardation layer containing a rodlike liquid crystal compound fixed in a homeotropic alignment state is also preferred. Though the kind of the homeotropic liquid crystal is not limited particularly and can be selected suitably, the examples include a polymeric liquid crystal formed by polymerizing a liquid crystal monomer, a liquid crystal polymer exhibiting a nematic liquid crystal property at a high temperature, and a mixture thereof. The polymeric liquid crystal can be obtained by adding an alignment auxiliary or the like to a liquid crystal monomer as required, and by polymerizing with ionizing radiation such as an electron beam and ultraviolet ray or with heat. Though the liquid crystal property can be either lyotropic or thermotropic, a thermotropic liquid crystal is preferred from aspects of easy control and easy formation of monodomain. Though the liquid crystal monomer is not limited particularly, the examples include a polymerizable mesogenic compound. Though the polymerizable mesogenic compound is not limited particularly, the examples are similar to the cholesteric liquid crystals.

A method of forming such a retardation layer is not limited particularly, but a known method can be used suitably. For example, an alignment film or the like can be used for the formation as in a case of the cholesteric liquid crystal. The homeotropic alignment can be obtained, for example, by coating the homeotropic liquid crystal on a perpendicularly-aligned film (e.g., long-chain alkylsilane) formed previously, expressing and fixing the liquid crystal state.

Furthermore, a retardation layer containing a discotic liquid crystal compound fixed in a nematic phase or columnar phase alignment state is preferred as well. Such a retardation layer can be formed, for example, by expressing a nematic phase or a columnar phase in a discotic liquid crystal material having a negative uniaxiality (e.g., a compound of phthalocyanine or triphenylene having a molecular spread within a plane), and fixing the state. Specific formation method is not limited particularly, and known methods can be used suitably.

Furthermore, the retardation layer preferably contains an inorganic layered compound having a negative uniaxiality, and the inorganic layered compound is in an alignment state where an optical axis direction of the retardation layer is fixed to be perpendicular (normal direction) to the plane. A method of forming the retardation layer is not limited particularly, and known methods can be used suitably. The negative uniaxial inorganic layered compound is explained in detail in JP 06(1994)-82777 A.

Figure 11:
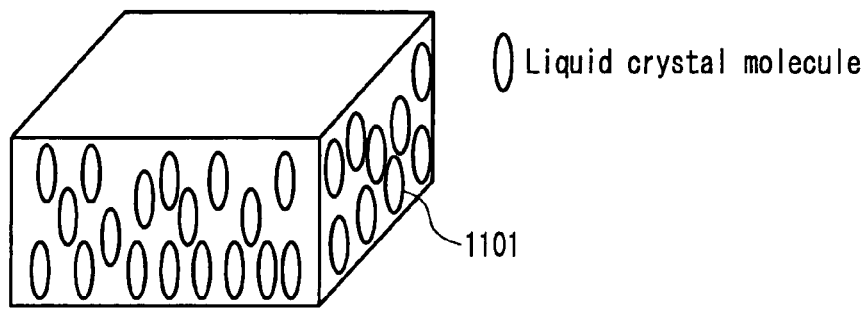
FIG. 11 is a schematic view of a retardation layer including homeotropically-aligned liquid crystal molecules.
Figure 12:
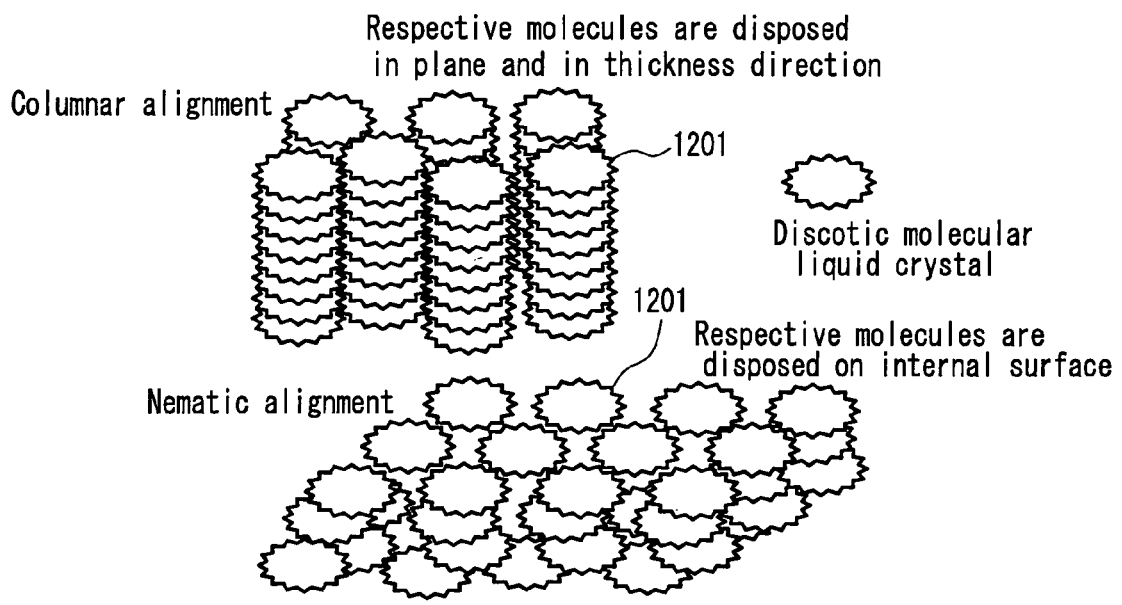
FIG. 12 is a schematic view of a retardation layer including a discotic liquid crystal.
Figure 13:
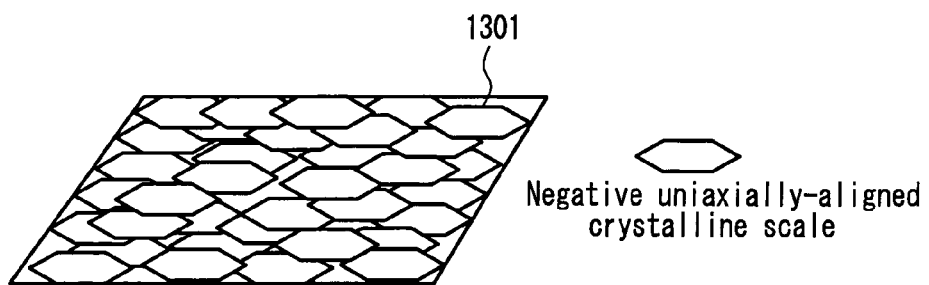
FIG. 13 is a schematic view of a retardation layer including an inorganic layered compound.

The schematic views of FIGS. 11-13 show respectively a retardation layer with a fixed homeotropic alignment state, a retardation layer using a discotic liquid crystal, and a retardation layer composed of an inorganic layered compound. In the drawings, reference numerals 1101, 1201 and 1301 denote respectively a homeotropic liquid crystal molecule, a discotic liquid crystal molecule, and a flake of a negative-uniaxial inorganic layered compound crystal.

Furthermore, a retardation layer containing a biaxially-aligned non-liquid crystal polymer is also preferred. A method of forming the retardation layer is not limited particularly, but known methods can be used suitably. The examples include a method of biaxially stretching in a good balance a polymer film having a positive refractive anisotropy, a method of pressing a thermoplastic resin, and a method of exciting a parallel-aligned crystalline. Alternatively, a solution of a certain non-liquid crystal polymer is applied onto a base and dried, and formed as a film, thereby a C-plate can be obtained. Though the non-liquid crystal polymer is not limited particularly, preferred examples include: polyester-based polymers such as polyethylene terephthalate and polyethylene naphthalate; cellulose-based polymers such as diacetyl cellulose and triacetyl cellulose; acrylic polymers such as polymethyl methacrylate; styrene-based polymers such as polystyrene and styrene-acrylonitrile copolymer (AS resin); polycarbonate-based polymers such as a copolymer of bisphenol A and carbonic acid; linear or branched polyolefins such as polyethylene, polypropylene, and ethylene-propylene copolymer; polyolefins including cyclo-structures, such as polynorbornene; vinyl chloride-based polymers; amide-based polymers such as nylon and aromatic polyamide; imide-based polymers; sulfone-based polymers; polyether-sulfone-based polymers; polyether ether ketone-based polymers; polyphenylene sulfide-based polymers; vinyl alcohol-based polymers; vinylidene chloride-based polymers; vinyl butyral-based polymers; arylate-based polymers; polyoxymethylene-based polymers; and epoxy-based polymers. These polymers can be used alone or in combination.

Furthermore, suitable additives can be added to these polymer materials for arbitrary purposes, e.g., providing extensibility and contractile property.

In addition, examples of the non-liquid crystal polymers include a resin composition containing a thermoplastic resin whose side chain has substituted or unsubstituted imide group(s) and a thermoplastic resin whose side chain has substituted or unsubstituted phenyl group(s) and cyano group(s). The example is a resin composition having an alternating copolymer including isobutene and N-methylene maleimide and a styrene-acrylonitrile copolymer. Further, for the polyimide-based film material, for example, materials described in U.S. Pat. Nos. 5,580,950 and 5,580,964 can be used suitably for retardation layers composed of non-liquid crystal polymers.

Next, since the polarization component of the present invention includes the two polarizer layers (reflective circular polarizer) that selectively transmit either clockwise circularly-polarized light or counterclockwise circularly-polarized light and selectively reflect the other, it is advantageous, for example, in having a polarization-separation function with respect to natural light entering at a wide angle, and thus it can be designed and manufactured easily.

Though there is no particular limitation about the reflective circular polarizer, it is further preferable that the planar alignment state of the cholesteric liquid crystal is fixed. Though the kind of the cholesteric liquid crystal can be selected suitably without any particular limitation, for example, a polymeric liquid crystal formed by polymerizing liquid crystal monomers, a liquid crystal polymer exhibiting a cholesteric liquid crystal property at a high temperature, and the mixture thereof can be used, as in the case of the retardation layer. The polymeric liquid crystal can be obtained by adding a chiral agent, an alignment auxiliary or the like to a liquid crystal monomer as required, and by polymerizing with ionizing radiation such as an electron beam and ultraviolet ray or with heat. Though the liquid crystal property of the cholesteric liquid crystal can be either lyotropic or thermotropic, a thermotropic liquid crystal is preferred from aspects of easy control and easy formation of monodomain.

Examples of the reflective circular polarizer include, more specifically, a sheet including a layer of a cholesteric liquid crystal polymer, a sheet formed by laminating the layer on a glass plate or the like, and a film of a cholesteric liquid crystal polymer, though the reflective circular polarizes are not limited thereto. Similarly, though methods of forming these cholesteric liquid crystal layers are not limited particularly, for example, such layers can be formed by a method similar to the case of a retardation layer including the cholesteric liquid crystal compound. It is more preferable that the cholesteric liquid crystal is aligned as uniformly as possible in the layer.

Regarding the reflective circular polarizer, it is more preferable that the selective reflection wavelength band covers a visible light region and a band of emission wavelength of a light source, from an aspect of performance of the polarization component, and the selective reflection wavelength band can be determined unequivocally on the basis of the cholesteric chiral pitch and the refractive index of the liquid crystal as described above. Corresponding to the purposes, the cholesteric liquid crystal layer composing the reflective circular polarizer can be formed, for example, by laminating a plurality of layers different from each other in the selective reflection wavelength bands. Alternatively, the cholesteric liquid crystal layer can be made of a single layer where the pitch changes in the thickness direction. For laminating plural layers, it is also possible to prepare several bases on which cholesteric liquid crystal layers are laminated previously, which are then laminated further. However, from an aspect of reducing the thickness or the like, a farther preferable method includes forming an alignment film on a cholesteric liquid crystal layer on which another cholesteric liquid crystal layer is laminated.

It is preferable that the polarization component of the present invention further includes a layer having a function of a quarter wavelength plate at least in the front direction, and the layer is disposed outside the reflective circular polarizer that is one of the two polarizer layers and that is positioned at the visible side. Due to the configuration, it is possible to modify a circularly polarized light beam passing through the reflective circular polarizer into a linearly polarized light beam in order to use the light effectively. It is particularly preferable that the polarization component includes further an absorptive dichroic polarizing plate, and the absorptive dichroic polarizing plate is disposed outside the additional layer having the function of a quarter wavelength plate at least in the front direction.

Though the absorptive dichroic polarizing plate is not limited particularly, the examples include: absorptive polarizing plates formed by adsorbing a dichroic material such as iodine or a dichroic dye in a hydrophilic polymer film such as a polyvinyl alcohol-based film, a partially-formalized polyvinyl alcohol-based film and partially-saponified film based on an ethylene-vinyl acetate copolymer, and stretching the same; and a polyene-alignment film made of dehydrated polyvinyl alcohol or polyvinyl chloride that has been treated to eliminate hydrochloric acid. An alternative example of the polarizing plate is formed by providing a transparent protective layer made of, for example, a plastic coating layer or a film laminate layer, on at least one surface of such a film for a purpose of maintaining the water-proof or the like. An alternative example is formed by containing transparent fine particles in the transparent protective layer so as to provide a fine irregularity on the surface. The transparent fine particles are, for example, inorganic fine particles having an average particle diameter of 0.5 to 5 µm, such as silica, alumina, titania, zirconia, stannic oxide, indium oxide, cadmium oxide and antimony oxide. These particles can be electroconductive. Furthermore, organic fine particles such as crosslinked or uncrosslinked polymers can be used as well.

FIRST EMBODIMENT

Figure 2:
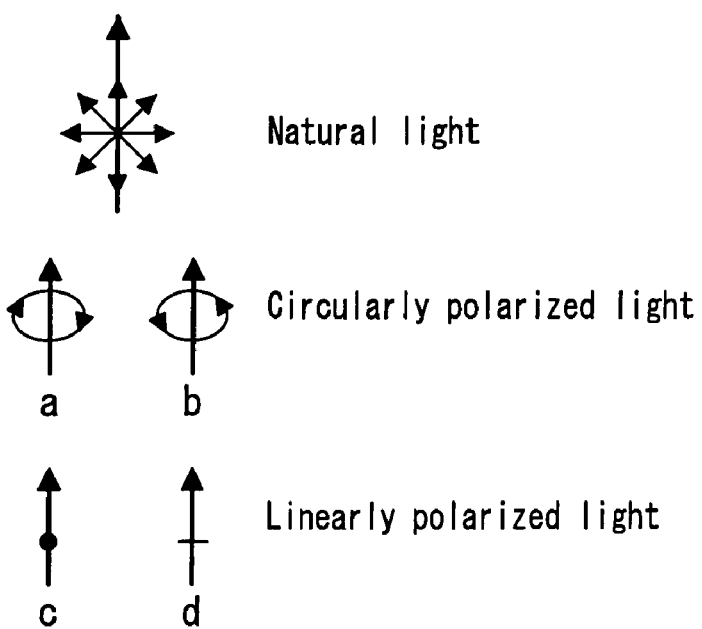
FIG. 2 is an explanatory view to show signs that represent natural light, circularly polarized light and linearly polarized light, according to the present invention.

Referring to FIGS. 1 and 2, a mechanism of simultaneous expression of focusing and brightness enhancement in a polarization component of the present invention will be described below. However, the description below refers to only one embodiment of the present invention, and the present invention will not be limited by the description.

FIG. 1 shows this embodiment for a polarization component of the present invention. As shown in this figure, this polarization component is formed by laminating main elements of a cholesteric liquid crystal circular polarizer 201 (hereinafter, this may be referred to as 'layer 1'), a C-plate 202 (hereinafter, this may be referred to as 'layer 2'), and a cholesteric liquid crystal circular polarizer 203 (hereinafter, this may be referred to as 'layer 3') in this order, and light beams enter from the layer 1 side. In the embodiment shown in this figure, rotational directions of circularly polarized light beams passing through the two reflective circular polarizer layers are the same. Since either the circular polarizer or the retardation layer does not have any optical axes present in the in-plane directions, the bonding directions of the circular polarizer and a retardation layer can be determined arbitrarily. For this reason, an angular range for limiting the light parallelizing has an isotropic and symmetric characteristic.

FIG. 2 is an explanatory view showing signs representing natural light, circularly polarized light and linearly polarized light according to the present invention. Circularly polarized light 'a' and circularly polarized light 'b' rotate in opposite directions, and linearly polarized light 'c' and linearly polarized light 'd' cross each other at right angles.

An ideal principle of operation in a case where a light beam enters the polarization component of FIG. 1 will be explained below sequentially by referring to the figure.

(1) First, among light beams fed from a backlight (a light source; not shown), a perpendicular-incident natural light beam 1 is polarized and separated by the. circular polarizer 201 (layer 1) into two circularly polarized light beams, i.e., a transmitted light beam 3 and a reflected light beam 2. The rotational directions of the circularly polarized light beams are opposite to each other.

(2) The transmitted light beam 3 passes through the retardation layer 202 (layer 2) and becomes a transmitted light beam 4.

(3) The transmitted light beam 4 passes through the circular polarizer 203 (layer 3) and becomes a transmitted light beam 5.

(4) The transmitted light beam 5 is used for a liquid crystal display apparatus disposed thereon.

(5) Next, among the light beams fed from the backlight, an obliquely-entering natural light beam 6 is polarized and separated by the circular polarizer 201 into two circularly polarized light beams of a transmitted light beam 8 and a reflected light beam 7. The circularly polarized light beams rotate in opposite directions.

(6) When passing through the retardation layer 202, the transmitted light beam 8 is provided with a retardation value of ½ wavelength and becomes a transmitted light beam 9.
(7) Under an influence of the retardation, the rotational direction of the circular polarization of the transmitted light beam 9 becomes opposite with respect to the light beam 8.
(8) The transmitted light beam 9 is reflected by the circular polarizer 203 and becomes a light beam 10.

It is known that a rotational direction of circularly polarized light is reversed generally at reflection (see, for example, "Polarized light: Production and Use", W. A. Schurcliff, Harvard University Press, Cambridge, Mass., 1966). However, it is also known that, as an exception, the rotational direction will not change in a case of reflection at a cholesteric liquid crystal layer (see, for example, "Ekisho Jiten (Dictionary for Liquid Crystal)", published by Baihuukan). Since reflection in this figure is carried out on a cholesteric liquid crystal surface, the rotational directions of the circularly polarized light beams 9 and 10 are not changed.

(9) When passing through the retardation layer 202, the reflected light beam 10 is influenced by the retardation and becomes a transmitted light beam 11.
(10) The rotational direction of the transmitted light beam 11 is reversed under the influence of the retardation.
(11) The light beam 11, whose rotational direction becomes identical again to that of the light beam 8, passes through the circularly polarizer 201 and becomes a transmitted light beam 12.
(12) The light beam 7 and the light beam 12 are returned to the backlight side and recycled. These returning light beams are reflected repeatedly until they become light beams that can pass through the polarization component in the vicinity of the normal direction, while changing the traveling direction and direction of the polarization at random by a diffusion plate or the like disposed on the backlight, thereby contributing enhancement of the brightness.
(13) The transmitted circularly polarized light beam 5 is converted into a linearly polarized light beam by a quarter wavelength plate (not shown), so that it can be used in a liquid crystal display or the like without causing any absorption losses. In this manner, focusing and brightness enhancement by the polarization component of FIG. 1 is carried out.

Next, a selective reflection wavelength band of the reflective polarizer will be explained.

The two reflective polarizer layers according to the present invention have selective reflection wavelength bands that can be the same or different from each other. For example, though one of the reflective polarizers can reflect in a whole band of visible light while the other can reflect partially, the selective reflection wavelength bands must overlap each other at least partially. The selective reflection wavelength bands of the reflective polarizers can be designed appropriately for example, corresponding to use of the polarization components and types of members and light sources to be combined in use. It is preferable, for example, that the selective reflection is achieved with respective to light beams having high visibility in the vicinity of a wavelength of 550 nm. Specifically, it is preferable that the overlapping regions of the selective reflection wavelength bands of the two reflective polarizer layers include a wavelength range of 540 nm to 560 nm. In a case of a reflective polarizer including a cholesteric liquid crystal compound, as mentioned above, the selective reflection wavelength bands can be determined unequivocally on the basis of a cholesteric chiral pitch and the refractive index of the liquid crystal; and the central wavelength of the selective reflection is represented by Formula (VIII)($\lambda$=np).

Furthermore, since white light is required when there is a need for color display, it is further preferable that the bands have uniform characteristics in a visible light band, or that at least an emission spectrum region of a light source (in many cases, 435 nm to 610 nm) can be covered. When considering that the selective reflection wavelength spectrum of the cholesteric liquid crystal is shifted to the short wavelength side (blue shift) with respect to an oblique incident light beam, it is further preferable that the overlapping region covers a region of a wavelength longer than 610 nm. Since the selective reflection wavelength band required for this long-wavelength side depends considerably on the angle and wavelength of incident light beams from the light source, an end of the long wavelength is set arbitrarily corresponding to the required specification. Specifically for example, in a backlight using a wedge-type light-guiding plate which is often used in a liquid crystal display, light emitted from the light-guiding plate has an angle of about 60° from a normal direction. The amount of the above-mentioned blue-shift tends to increase as the incidence angle is larger, and it is about 100 nm at an angle of about 60°. Therefore, when a three-wavelength cold cathode ray tube is used for the backlight and when the red bright-line spectrum is 610 nm, it will be acceptable that the above-mentioned overlapping region of the selective reflection wavelength bands reaches closer to the side with a wavelength longer than 710 nm. Further, from aspects of resolution of coloration and RGB in a liquid crystal display apparatus or the like, it is particularly preferable that the selective reflection wavelength bands overlap each other in an entire visible light wavelength region, i.e., a range of 380 nm to 780 nm.

When the backlight emits only light of a specified wavelength, e.g., for a case of using a colored cold cathode ray tube, it would be sufficient if only an obtainable bright-line spectrum can be shielded. Furthermore, since transmitted light beams entering at large angles can be ignored when a light beam emitted from the backlight is stopped down to some degrees from the beginning in the front direction due to the design of the microlens, dot, and prism processed on the moving subject, there is no need for extending the selective reflection wavelength considerably to the long wavelength side.

Next, a retardation value for the retardation layer will be described.

The oblique direction retardation value R' of the retardation layer (see Formula (II) above) should be $\lambda/2$ ($\lambda$ denotes a wavelength of incident light) ideally for the reflective polarizer to entirely reflect a light beam passing through the retardation layer, but in fact, the object can be achieved even if the value is not $\lambda/2$ strictly. Furthermore, since the oblique direction retardation value R' is changed due to the incidence angle, that is, it tends to be increased in general with an increase of the incidence angle, for causing efficient conversion in polarization, the retardation value R' must be determined suitably by considering the angle for entire reflection or the like. For example, for an entire reflection at an angle formed by a normal being about 60°, the value should be set so that the retardation at a measurement at 60° will be about $\lambda/2$. There is no particular limitation about the method for adjusting the oblique direction retardation value R', and known methods can be applied suitably. For example, when the retardation layer is a biaxially stretched film, the adjustment can be conducted using the stretching ratio, film thickness or the like.

Furthermore, a light beam transmitted through the reflective polarizer may change its polarization state due to the birefringence or the like of the reflective polarizer itself that functions like a C-plate. For example, a reflective circular polarizer including a cholesteric liquid crystal layer can have some properties of a retardation layer such as a negative C-plate due to the twist structure of the cholesteric liquid crystal compound. Therefore, it is possible to adjust the oblique direction retardation value R' of the retardation layer to be smaller than $\lambda/2$ by considering the retardation of the reflective polarizer. Specifically, R' should be at least $\lambda/8$ as represented in Formula (II). The upper limit of the R' is not determined particularly, and it can be set suitably corresponding to the object. As mentioned above, the in-plane retardation R (see Formula (I)) is preferred to be smaller.

Figure 10:
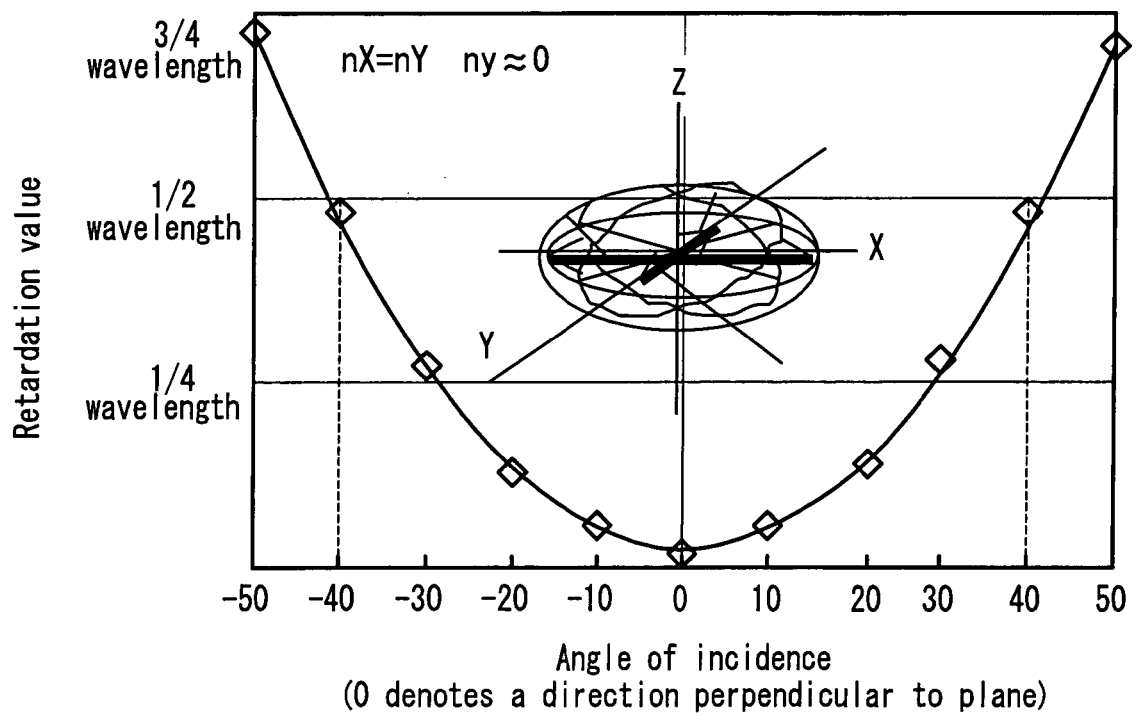
FIG. 10 is a schematic view to show one example of optical properties of a negative C-plate.

For reference, FIG. 10 shows an index ellipsoid representing clearly a relationship between an incidence angle of a C-plate and retardation, and the optical anisotropy of the C-plate. However, this is just an example, and thus it does not intend to limit the present invention. FIG. 10 shows an example where the birefringent resin has biaxial alignment of front retardation≈0 and oblique retardation=½ wavelength, and in this case, a ½ wavelength is obtained at a position of ±40 degrees.

The embodiment as described above regarding a use of a reflective circular polarizer is not limited thereto, but can be modified in many ways. For example, in the present invention, the C-plate used for the retardation layer can be replaced by a half wavelength plate (also referred to as a half wavelength retardation plate). That is, a polarization component of the present invention may include at least two reflective circular polarizer layers and a half wavelength plate disposed between the reflective circular polarizer layers, wherein the reflective circular polarizer layers have selective reflection wavelength bands for selective reflection of polarized light overlapping each other at least partially. In this case, it is preferable that the rotational directions of circularly polarized light beams passing through each of the two reflective circular polarizer layers are opposite each other, and it is ideal that the oblique direction retardation value in the half wavelength plate is 0 or $\lambda$. When setting the oblique direction retardation value, the retardation value of the reflective circular polarizer layer should be considered as in the case of using a C-plate.

When using the half wavelength plate, problems of anisotropy or coloration may occur depending on azimuth of the inclined axis. However, for example, such coloration can be compensated, for the respective layers of the two reflective circular polarizer layers and the retardation layer, by using layers different from each other in the wavelength diffusion properties.

SECOND EMBODIMENT

Another embodiment of the present invention will be described below.

In the polarization component of the present invention, the reflective polarizer can be a reflective linear polarizer. More specifically, a polarization component of the present invention may include at least two reflective polarizer layers and an intermediate layer disposed between the reflective polarizer layers, the two reflective polarizer layers are reflective linear polarizer layers that selectively transmit one of linearly polarized light beams crossing each other at right angles while selectively reflecting the other, the two reflective linear polarizer layers have selective reflection wavelength bands for selective reflection of polarized light, the bands overlapping each other at least partially, the intermediate layer comprises a single optical layer or a laminate of at least two optical layers, and the intermediate layer has a function of transmitting an incident linearly polarized light beam while changing or not changing the polarization direction, according to the incidence direction, the two reflective linear polarizer layers are disposed at an angle so as to have in-plane slow axis directions for transmitting a light beam that is included in incident linearly polarized light and that enters in a direction (normal direction) perpendicular to the incidence surface while efficiently reflecting a light beam entering from an oblique direction.

Such a polarization component can be prepared, for example, by combining a reflective linear polarizer and a quarter wavelength plate (also referred to as a quarter wavelength retardation plate) to sandwich a C-plate. More specifically, a preferable polarization component includes at least two reflective linear polarizer layers, and a retardation layer and two quarter wavelength plate layers both of which are disposed between the reflective linear polarizer layers; wherein one of the quarter wavelength plate layers is disposed between one of the reflective linear polarizer layers and the retardation layer, and the other quarter wavelength plate is disposed between the other reflective linear polarizer layer and the retardation layer; the two reflective linear polarizer layers have selective reflection wavelength bands for selective reflection of polarized light, the selective reflection wavelength bands overlapping each other at least partially, and the quarter wavelength plate positioned on one of the surfaces of the retardation layer has an in-plane slow axis forming an angle of 40° to 50° with respect to the polarization axis of the reflective linear polarizer layer positioned on the same side of the retardation layer; the other quarter wavelength plate positioned on the other surface of the retardation layer has an in-plane slow axis forming an angle of −40° to −50° with respect to the polarization axis of the reflective linear polarizer layer positioned on the same side of the retardation layer; and an angle formed by the in-plane slow axes in the two reflective linear polarizer layers is determined arbitrarily. In this case, the retardation layer must satisfy the following Formulae (I) and (III).

$$R \geq (\lambda/10) \qquad (I)$$

$$R' \geq (\lambda/4) \qquad (III)$$

Definitions of $\lambda$, R and R' in Formulae (I) and (III) are described above.

Figure 3:
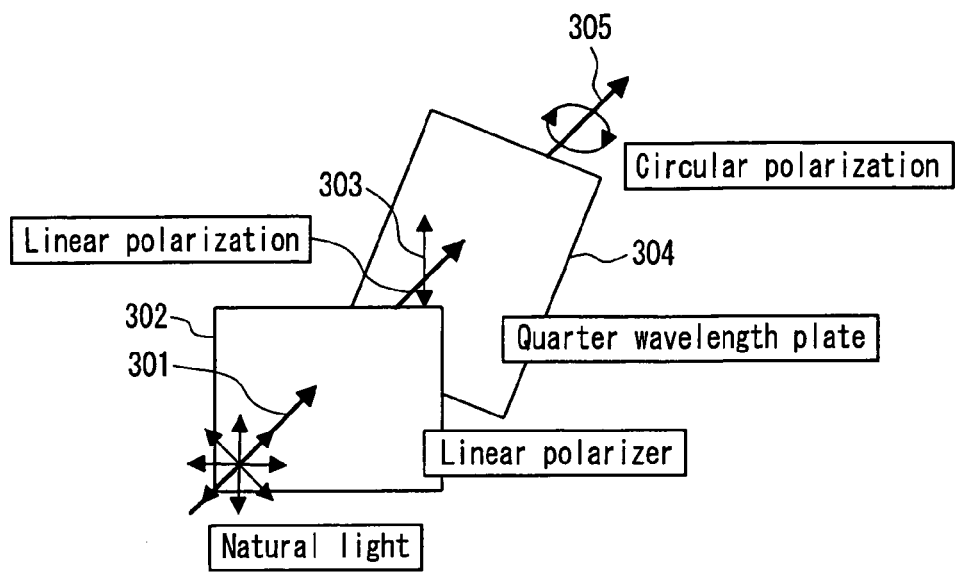
FIG. 3 is a schematic diagram of circular polarization by a combination of a linear polarizer and a quarter wavelength plate.

It has been known that natural light can be converted to circularly polarized light by a combination of a linear polarizer and a quarter wavelength plate. As shown in FIG. 3, a natural light beam 301 entering a linear polarizer 302 is converted to a linearly polarized light beam 303, and further the linearly polarized light beam 303 passing through a quarter wavelength plate 304 is converted to a circularly polarized light beam 305. The reflective circular polarizer layer and the reflective linear polarizer layer are advantageous in comparison with a prism type reflective polarizer based on principles such as Brewster's angle in that it is less dependent on the incidence angle.

When simply sandwiching a C-plate by reflective linear polarizer layers, an optical axis with respect to light beams entering the C-plate from an oblique direction will cross the direction of light beam always at right angles, and thus no retardation will be expressed, and polarization conversion will not occur. In such a case, a linearly polarized light beam is converted to a circularly polarized light beam by a quarter wavelength plate having a slow axis direction of 45° or −45° with respect to a polarization axis of the reflective linear polarizer layer, and subsequently, converted to a reverse circularly polarized light beam by using retardation of the C-plate, which is then converted again to a linearly polarized light beam by a quarter wavelength plate.

The quarter wavelength plate and the half wavelength plate according to the present invention are not limited particularly, and any known plates can be used suitably. Specific examples include uniaxially-stretched or biaxially-stretched polymer films, layers formed by hybrid-aligning (i.e., uniaxially aligning in the plane direction and further aligning in the thickness direction) liquid crystal compounds, and the like. There is no particular limitation about the method of controlling the in-plane retardation in the quarter wavelength plate and the half wavelength plate, and for example, a stretched polymer film can be controlled by adjusting the stretch ratio, film thickness and the like.

Though polymers that can be used for the polymer films are not limited particularly, preferable examples include: polyester-based polymers such as polyethylene terephthalate and polyethylene naphthalate; cellulose-based polymers such as diacetyl cellulose and triacetyl cellulose; acrylic polymers such as polymethyl methacrylate; styrene-based polymers such as polystyrene and styrene-acrylonitrile copolymer (AS resin); polycarbonate-based polymers such as a copolymer of bisphenol A and carbonic acid; linear or branched polyolefins such as polyethylene, polypropylene, and ethylene-propylene copolymer; polyolefins including cyclo-structures, such as polynorbornene; vinyl chloride-based polymers; amide-based polymers such as nylon and aromatic polyamide; imide-based polymers; sulfone-based polymers; polyether-sulfone-based polymers; polyether ether ketone-based polymers; polyphenylene sulfide-based polymers; vinyl alcohol-based polymers; vinylidene chloride-based polymers; vinyl butyral-based polymers; arylate-based polymers; polyoxymethylene-based polymers; and epoxy-based polymers. These polymers can be used alone or in combination. Furthermore, suitable additives can be added to these polymer materials for arbitrary purposes, e.g., providing extensibility and contractile property.

Similarly, methods of manufacturing the polymer films are not limited particularly, and polymer films manufactured by casting (extrusion) and polymer films manufactured by melting the polymer material, shaping to a film and stretching, can be used. The latter example is preferred from an aspect of mechanical strength or the like.

Another example of the polymer film is described in JP 2001-343529A (WO01/37007). For the materials of the polymer film, for example, a resin composition containing a thermoplastic resin whose side chain has substituted or unsubstituted imide group(s) and a thermoplastic resin whose side chain has substituted or unsubstituted phenyl group(s) and cyano group(s) can be used. The example is a resin composition having an alternating copolymer including isobutene and N-methylene maleimide and a styrene-acrylonitrile copolymer.

Similarly, a reflective linear polarizer of the present invention is not limited particularly, and known products can be used. Specifically for example, a stretched film having an optical anisotropy, a laminate thereof and the like can be used, and the material of the stretched film can be similar to those of the quarter wavelength plate and the half wavelength plate.

Figure 4:
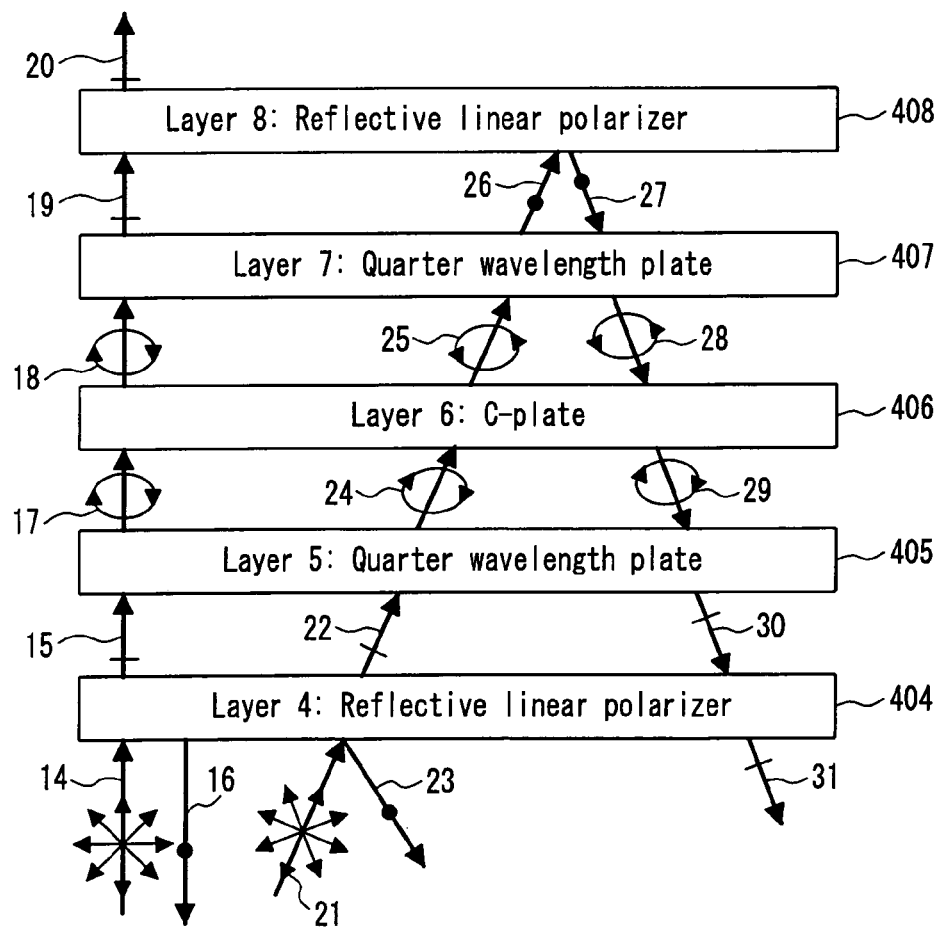
FIG. 4 shows a mechanism of simultaneous expression of focusing and brightness enhancement in one embodiment of a polarization component of the present invention, where a reflective linear polarizer, a C-plate and a quarter wavelength plate are combined.

FIG. 4 is a schematic view showing a polarization component of this embodiment, though the present embodiment will not be limited to this example. As shown in this figure, this polarization component is formed by laminating main elements, i.e., a reflective linear polarizer 404 (hereinafter this may be called 'layer 4'), a quarter wavelength plate 405 (hereinafter this may be called 'layer 5'), a C-plate 406 (hereinafter this may be called 'layer 6'), a quarter wavelength plate 407 (hereinafter this may be called 'layer 7'), and a reflective linear polarizer 408 (hereinafter this may be called 'layer 8') in this order, and light enters from the layer 4 side.

Figure 5:
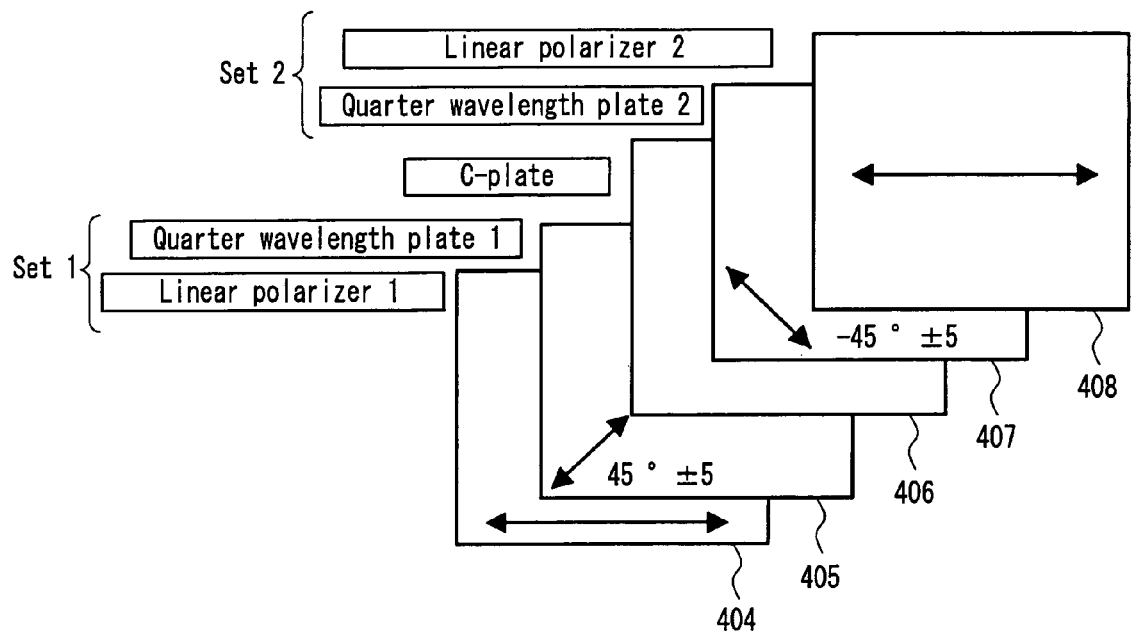
FIG. 5 is a schematic view to show angles formed by respective layers in the polarization component of FIG. 4.
Figure 14:
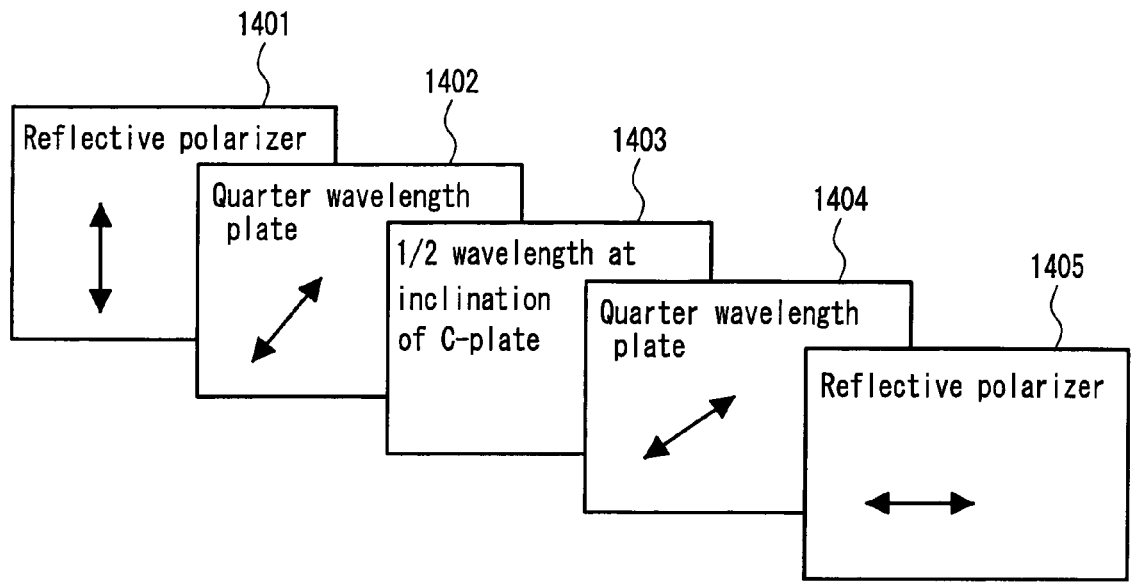
FIG. 14 shows one example of bonding angles between respective layers in a case of combining a reflective linear polarizer, a C-plate and a quarter wavelength plate, according to a polarization component of the present invention.

FIG. 5 is a schematic view to show angles for bonding the respective main elements in the polarization component of FIG. 4. An angle formed by the polarization axis of the linear polarizer 404 and the in-plane slow axis of the quarter wavelength plate 405 is in a range of 40° to 50°, and an angle formed by the polarization axis of the linear polarizer 408 and the in-plane slow axis of the quarter wavelength plate 407 is in a range of −40° to −50°. Excepting this, there is no particular limitation about angles formed by the respective elements, and similar performance can be obtained even by arbitrarily rotating a set 1 (a combination of the linear polarizer 404 and the quarter wavelength plate 405 ) and a set 2 (a combination of the linear polarizer 408 and the quarter wavelength plate 407 ) while maintaining the above-mentioned angles. For example, FIG. 14 shows an example where the set 2 as shown in FIGS. 4 and 5 is rotated by 90°. Even this example can exhibit performance just as shown in FIGS. 4 and 5. Since the C-plate does not have an optical axis within the plane, the angle for bonding can be decided arbitrarily.

An ideal operation principle in a case where a light beam enters the polarization component of the present embodiment will be described below, by referring to FIG. 4.

(1) First, a natural light beam 14 is emitted from a backlight (light source) so as to enter the reflective linear polarizer 404 (layer 4) perpendicularly.

(2) The light beam 14 is separated into a linearly polarized light beam 15 and a linearly polarized light beam 16 crossing at right angles. The light beam 15 passes through the layer 4, and the light beam 16 is reflected.

(3) The linearly polarized light beam 5 passes through the quarter wavelength plate 405 (layer 5) and is converted to a circularly polarized light beam 17.

(4) The circularly polarized light beam 17 passes through the C-plate 406 (layer 6) as a circularly polarized light beam 18, without changing its polarization state.

(5) The circularly polarized light beam 18 passes through the quarter wavelength plate 407 (layer 7) and is converted to a linearly polarized light beam 19.

(6) The linearly polarized light beam 19 passes through the C-plate 408 (layer 8) as a linearly polarized light beam 20, without changing its polarization state.

(7) The linearly polarized light beam 20 enters an apparatus (a liquid crystal display apparatus or the like), and is transmitted without losses.

(8) From the backlight, in addition to the natural light beam 14 from a perpendicular direction, a natural light beam 21 is emitted to enter obliquely the layer 4.

(9) The light beam 21 is separated into a linearly polarized light beam 22 and a linearly polarized light beam 23 crossing at right angles. The light beam 22 passes through the layer 4 (reflective linear polarizer), and the light beam 23 is reflected.

(10) The linearly polarized light beam 22 passes through the layer 5 (reflective linear polarizer) and is converted to a circularly polarized light beam 24.

(11) The circularly polarized light beam 24 is subjected to retardation of ½ wavelength when passing through the layer 6 (C-plate) so as to reverse the rotation direction and become a circularly polarized light beam 25.

(12) The circularly polarized light beam 25 passes through the layer 7 (a quarter wavelength plate) and is converted to a linearly polarized light beam 26.

17

(13) The linearly polarized light beam 26 is reflected by the layer 8 (reflective linear polarizer) and becomes a linearly polarized light beam 27.
(14) The linearly polarized light beam 28 passes through the layer 7 (a quarter wavelength plate) and is converted to a circularly polarized light beam 28.
(15) The circularly polarized light beam 28 is subjected to retardation of a half wavelength plate when passing through the layer 6 (C-plate) so as to reverse the rotation direction and become a circularly polarized light beam 29.
(16) The circularly polarized light beam 29 passes through the layer 5 (a quarter wavelength plate) and is converted to a linearly polarized light beam 30.
(17) The linearly polarized light beam 30 passes through the layer 4 (reflective linear polarizer) as a linearly polarized light beam 31, without changing its polarization state.
(18) The reflected light beams 16, 23 and 31 are returned to the backlight side and recycled. The recycling mechanism is the same as that of First Embodiment.

In this embodiment, the angle formed by the polarization axis of the reflective linear polarizer and the in-plane slow axis of the quarter wavelength plate in the set 1 and set 2 (FIG. 5) should be 45° and −45° theoretically in an ideal system. However, since the characteristics of the reflective polarizer and wavelength plate are not perfect in fact in the visible light range and there are subtle changes for respective wavelengths, problems such as coloration can occur. Such problems like coloration can be solved by compensating the color tone by shifting the angle to some degrees so as to optimize the entire system rationally. Since other problems such as degradation in the transmittance may occur when the angle is considerably out of 45° or −45°, the adjustment will be limited to a range of ±5°

A preferable range for the selective reflection wavelength band of the reflective linear polarizer is similar to that of the reflective circular polarizer. Just as the case of the reflective circular polarizer, the wavelength property of a transmitted light beam is shifted toward the short wavelength side with respect to a light beam entering in the oblique direction, preferably it has a sufficient polarization property and a retardation property in the long wavelength side out of the visible light region, so that the reflective linear polarizer functions sufficiently with respect to a light beam entering at a deep angle.

Furthermore, for the preferable range of the oblique direction retardation value R' (Formula (III)) in a retardation layer (C-plate) in this embodiment, it can be adjusted on the basis of the idea similar to the case of using a reflective circular polarizer. However, since a typical reflective linear polarizer has itself a smaller retardation property in comparison with a reflective circular polarizer, the R' of at least ⅛ wavelength is insufficient, but it should be ¼ wavelength or larger.

Figure 15:
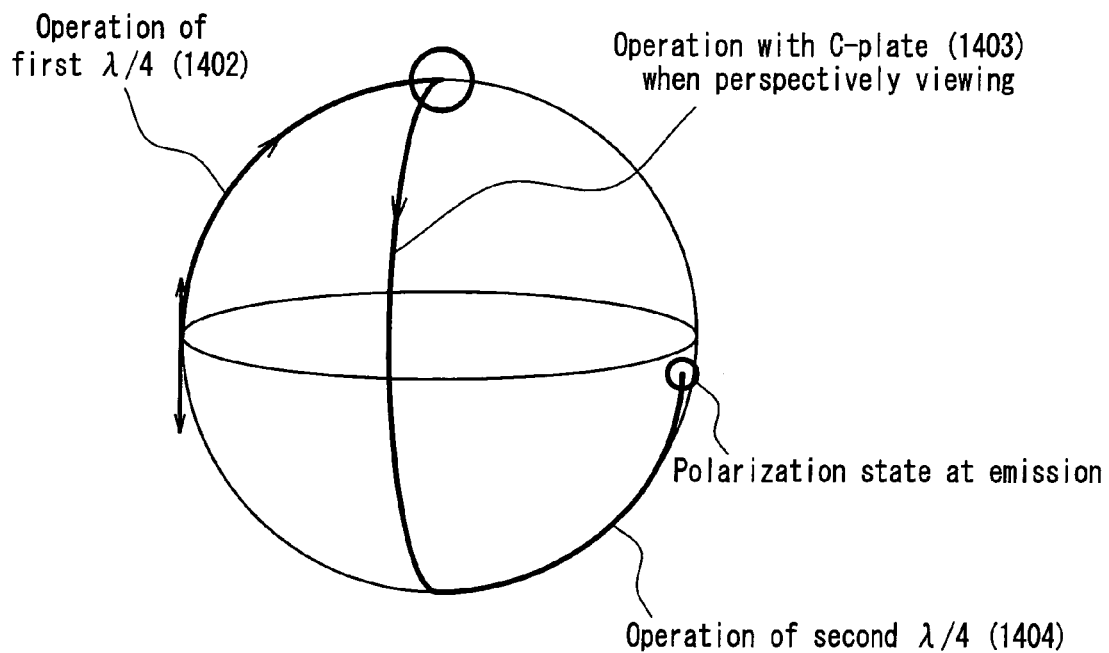
FIG. 15 is an explanatory view to show a conversion path for light beams in the polarization component of FIG. 14, indicated with a Poincare sphere.

In FIG. 15, a change in polarization state caused by a quarter wavelength plate, a C-plate and another quarter wavelength plate, which are placed between two reflective polarizers, is indicated on a Poincare sphere, for a case where an oblique incident light beam enters the polarization component of FIG. 14. The figure shows that a linearly polarized light beam entering from the first reflective polarizer is converted to a circularly polarized light beam and to a reversed linearly polarized light beam. However, this is an illustration to show one example of the present invention, not to limit the present invention.

THIRD EMBODIMENT

Another embodiment of the present invention will be described below.

Similar effects can be obtained in this embodiment by laminating, at right angles or in parallel, two biaxial films whose front retardation (in-plane retardation) is λ/4 and whose thickness direction retardation is at least λ/2, instead of using a structure formed by sandwiching a C-plate with two quarter wavelength plate layers. In this case, a Nz coefficient (thickness direction retardation /in-plane retardation) of 2 or more can satisfy the requirement.

That is, a polarization component of the present invention may include at least two reflective linear polarizer layers and two quarter wavelength plate layers disposed between the reflective linear polarizer layers, wherein the two reflective linear polarizer layers have selective reflection wavelength bands for selective reflection of polarized light, the selective reflection wavelength bands overlapping each other at least partially, an in-plane slow axis of one of the quarter wavelength plates forms an angle of 40° to 50° with respect to a polarization axis of the reflective linear polarizer layer positioned on the same side of the polarization component, an in-plane slow axis of the other quarter wavelength plate forms an angle of −40° to −50° with respect to a polarization axis of the reflective linear polarizer layer on the same side of the polarization component, an angle formed by the in-plane slow axes of the two quarter wavelength plate layers is determined arbitrarily, and the quarter wavelength plate layers satisfy respectively the condition of Formula (IV) below:

$$Nz \geq 2.0 \quad (IV)$$

where $Nz=(nx-nz)/(nx-ny)$.

In Formula (IV), nx, ny and nz are respectively refractive indices in X-axis, Y-axis and Z-axis directions in the quarter wavelength plate, where the X-axis direction is a direction showing a maximum refractive index within the plane of the quarter wavelength plate (in-plane slow axis direction), the Y-axis direction is a direction perpendicular to the X-axis within the plane of the quarter wavelength plate (in-plane fast axis direction), and the Z-axis direction is a thickness direction of the quarter wavelength plate and perpendicular to the X-axis direction and to the Y-axis direction.

There are no specific limitations about the materials of the quarter wavelength plate and the reflective linear polarizer layer, or the methods of controlling the in-plane retardation and the thickness direction retardation, and description in Second Embodiment can be applied.

Figure 6:
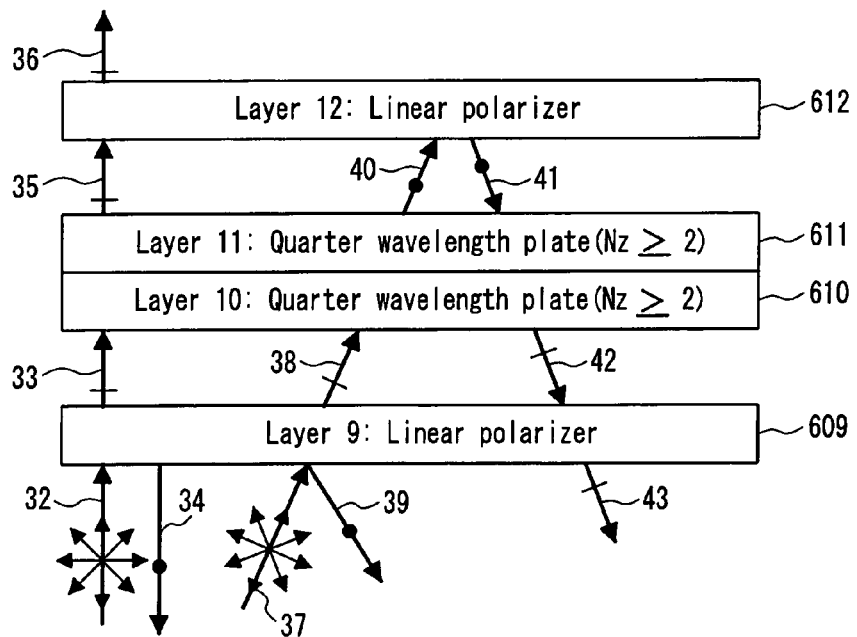
FIG. 6 shows a mechanism of simultaneous expression of focusing and brightness enhancement in one embodiment of a polarization component of the present invention, where a reflective linear polarizer and a quarter wavelength plate ($Nz \geq 2$) are combined.

FIG. 6 is a schematic view showing a polarization component of this embodiment, though the present embodiment is not limited thereto. As shown in this figure, this polarization component is formed by laminating main elements, i.e., a reflective linear polarizer 609 (hereinafter this may be called 'layer 9'), a quarter wavelength plate 610 (hereinafter this may be called 'layer 10'), a quarter wavelength plate 611 (hereinafter this may be called 'layer 11'), and a reflective linear polarizer 612 (hereinafter this may be called 'layer 12') in this order, and light enters from the layer 9 side.

Figure 7:
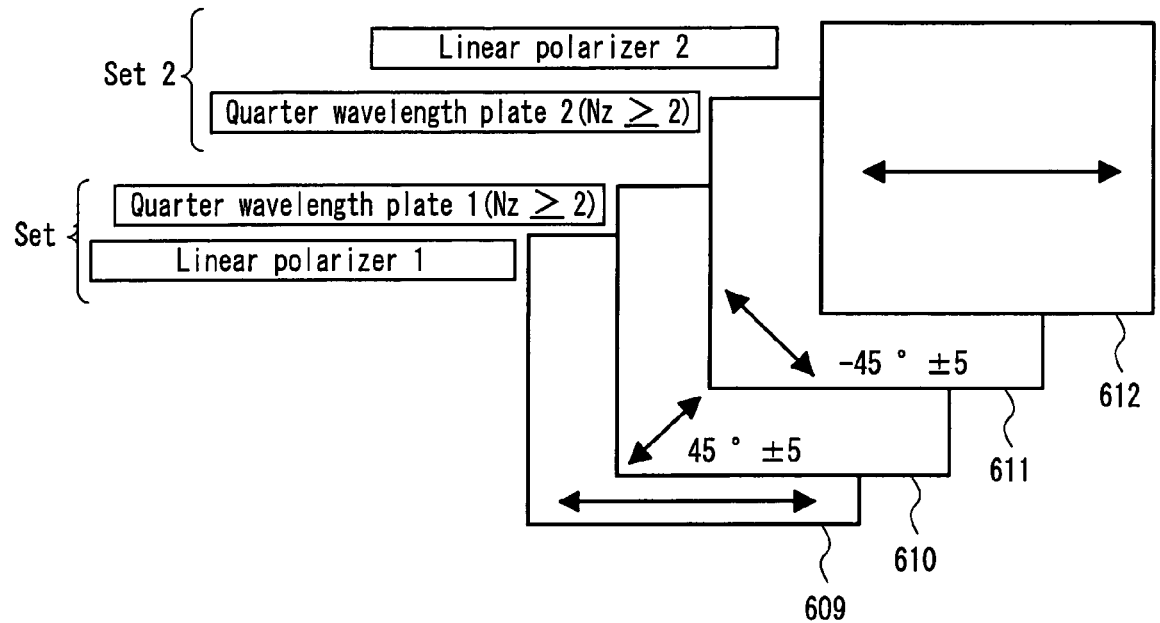
FIG. 7 is a schematic view to show angles formed by respective layers in the polarization component of FIG. 6.

FIG. 7 is a schematic view to show angles for bonding the respective main elements in the polarization component of FIG. 6. An angle formed by the polarization axis of the linear polarizer 609 and the in-plane slow axis of the quarter wavelength plate 610 is in a range of 40° to 50°, and an angle formed by the polarization axis of the linear polarizer 612 and the in-plane slow axis of the quarter wavelength plate 611 is in a range of −40° to −50°. Excepting this, there is no particular limitation about angles formed by the respective elements, and similar performance can be obtained even by arbitrarily rotating a set 1 (a combination of the linear polarizer 609 and the quarter wavelength plate 610) and a set 2 (a combination of the linear polarizer 612 and the quarter wavelength plate 611) while maintaining the above-mentioned angles. For convenience in explanation, FIGS. 6 and 7 show an example in which axes of the upper and lower linear polarizers are parallel and the axes of the quarter wavelength plate layers cross each other at right angles, but the example is non-limiting.

An ideal operation principle in a case where a light beam enters the polarization component of the present embodiment will be described below, by referring to FIG. 6.

(1) First, a natural light beam 32 emitted from a backlight (light source) enters perpendicularly.
(2) The natural light beam 32 is separated by the layer 9 (reflective linear polarizer) into a linearly polarized light beam 33 and a linearly polarized light beam 34 crossing at right angles. The linearly polarized light beam 33 passes through the layer 9 and the linearly polarized light beam 34 is reflected.
(3) The linearly polarized light beam 33 passes through the layer 10 and the layer 11 (quarter wavelength plates). Since the in-plane slow axes of the layer 10 and of the layer 11 cross at right angles in the example as shown in this figure, when considering a combination of the layer 10 and the layer 11, the front retardation (in-plane retardation) becomes 0. As a result, when passing through the layers 10 and 11, the linearly polarized light beam 33 becomes a linearly polarized light beam 35 without changing its polarization state.
(4) The linearly polarized light beam 35 passes through the layer 12 (reflective linear polarizer) without changing its polarization state, and becomes a linearly polarized light beam 36.
(5) The linearly polarized light beam 36 is transmitted to an apparatus (e.g., a liquid crystal display apparatus), without losses.
(6) From the backlight, in addition to the natural light beam 32 that enters perpendicularly, a natural light beam 37 is emitted to enter obliquely.
(7) The natural light beam 37 is separated by the layer 9 (reflective linear polarizer) into a linearly polarized light beam 38 and linearly polarized light beam 39 crossing at right angles. The linearly polarized light beam 38 passes through the layer 9, and the linearly polarized light beam 39 is reflected.
(8) The linearly polarized light beam 38 enters obliquely the layer 10 and the layer 11, and when passing through these layers, it becomes a linearly polarized light beam 40 as the polarization axis direction changes by 90° under an influence of the thickness direction retardation.
(9) The linearly polarized light beam 40 enters the layer 12 (reflective linear polarizer).
(10) Since the layer 12 has the same axial direction as the layer 9, the linearly polarized light beam 40 is reflected by the layer 12 and becomes a linearly polarized light beam 41.
(11) The linearly polarized light beam 41 is subjected to an influence by retardation as mentioned in the above (9) when passing through the layer 10 and the layer 11, thereby changing the polarization axis direction by 90° so as to become a linearly polarized light beam 42.
(12) The linearly polarized light beam 42 passes through the layer 9 (reflective linear polarizer) without changing its polarization state, and becomes a linearly polarized light beam 43.
(13) The reflected light beams 34, 39 and 43 are returned to the backlight side and recycled. The recycling mechanism is the same as described in First and Second Embodiments.

The polarization component of this embodiment can exhibit a performance similar to that of the polarization component of Second Embodiment. Furthermore, since the C-plate can be omitted, the polarization component in this embodiment is superior to the polarization component of Second Embodiment in the production efficiency. Though there is no particular limitation about the quarter wavelength plate in this embodiment and the above-mentioned one can be used, for example, films of a biaxially-stretched polycarbonate (PC) and polyethylene terephthalate (PET) or a layer of hybrid-aligned liquid crystal compound are further preferred.

Regarding the range of angles formed by the reflective linear polarizer and the quarter wavelength plate, the above description can be applied, and it can be slightly adjusted on the basis of the concept as in the Second Embodiment.

Similarly, regarding the selective reflection wavelength band of the reflective linear polarizer, the First and Second Embodiments can be applied.

Furthermore in this embodiment, the use efficiency of an oblique incident light beam is changed by changing the value of Nz (Formula (IV)). The preferable range is not limited particularly, and it can be adjusted to obtain an optimum efficiency for light utilization on the basis of a concept as in First and Second Embodiments. This embodiment is similar to the respective embodiments mentioned above in that the retardation of the reflective polarizer must be taken into consideration.

FOURTH EMBODIMENT

Another embodiment of the present invention will be described below.

Similar effects can be obtained by using a biaxial film whose front retardation (in-plane retardation) is λ/2 and whose thickness direction retardation is at least λ/2, instead of a structure formed by sandwiching a C-plate with two quarter wavelength plate layers as in Second Embodiment. In this case, a Nz coefficient of 1.5 or more can satisfy the requirement.

That is, a polarization component of the present invention may include at least two reflective linear polarizer layers and a half wavelength plate disposed between the reflective linear polarizer layers, wherein the two reflective linear polarizer layers have selective reflection wavelength bands for selective reflection of polarized light, the selective reflection wavelength bands overlapping each other at least partially, the in-plane slow axis of the half wavelength plate forms an angle of 40° to 50° with respect to a polarization axis of one of the reflective linear polarizer layers, and also forms an angle of −40° to −50° C. with respect to a polarization axis of the other reflective linear polarizer layer, and the half wavelength plate satisfies Formula (V) below:

$$Nz \geq 1.5 \quad (V)$$

where $Nz=(nx-nz)/(nx-ny)$.

In Formula (V), nx, ny and nz are respectively refractive indices in X-axis, Y-axis and Z-axis directions in the half wavelength plate, where the X-axis direction is a direction showing a maximum refractive index within the plane of the half wavelength plate (in-plane slow axis direction), the Y-axis direction is a direction perpendicular to the X-axis direction within the plane of the half wavelength plate (in-plane fast axis direction), and the Z-axis direction is a thickness direction of the half wavelength plate and perpendicular to the X-axis direction and to the Y-axis direction.

There are no specific limitations about the materials and methods of manufacturing the reflective linear polarizer and the wavelength plate, and descriptions in previous embodiments can be applied.

Figure 8:
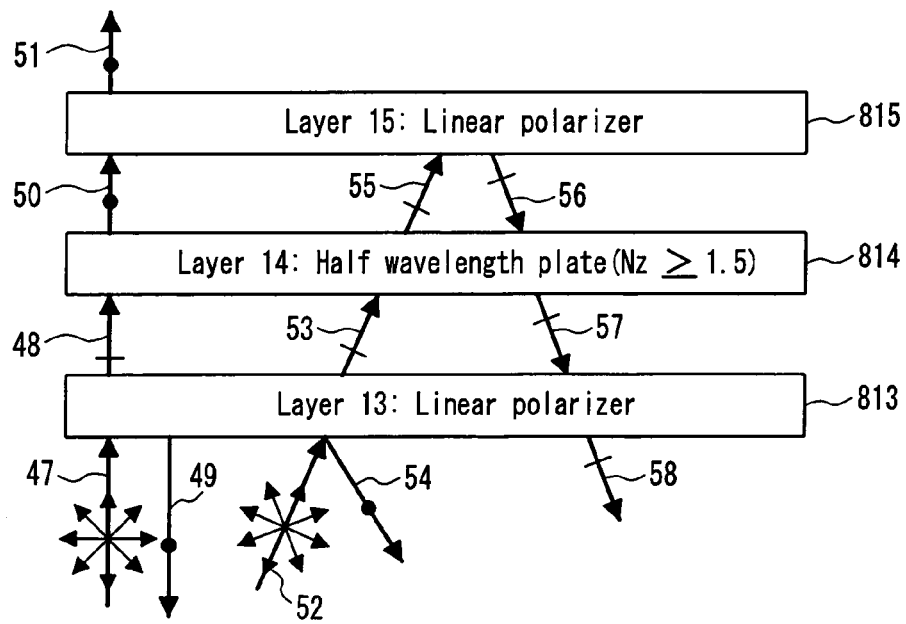
FIG. 8 shows a mechanism of simultaneous expression of focusing and brightness enhancement in one embodiment of a polarization component of the present invention, where a reflective linear polarizer and a half wavelength plate ($Nz \geq 1.5$) are combined.

FIG. 8 is a schematic view showing a polarization component of this embodiment, though the present embodiment is not limited thereto. As shown in this figure, this polarization component is formed by laminating main elements, i.e., a reflective linear polarizer 813 (hereinafter this may be called 'layer 13'), a half wavelength plate 814 (hereinafter this may be called 'layer 14'), and a reflective linear polarizer 815 (hereinafter this may be called 'layer 15') in this order, and light enters from the layer 13 side.

Figure 9:
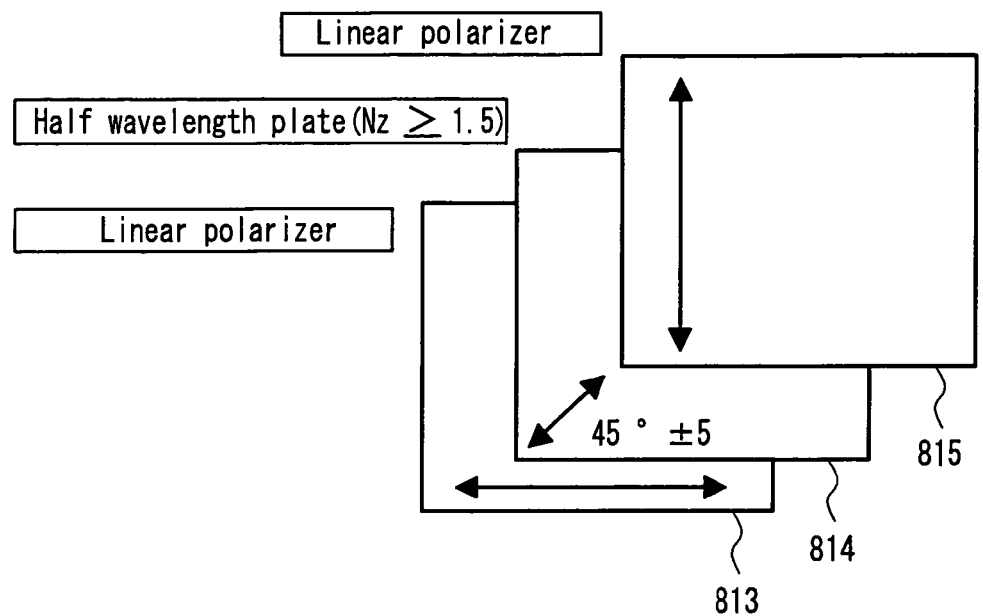
FIG. 9 is a schematic view to show angles formed by respective layers in the polarization component of FIG. 8.

FIG. 9 is a schematic view to show angles for bonding the respective main elements in the polarization component of FIG. 8. An angle formed by the polarization axis of the linear polarizer 813 and the in-plane slow axis of the half wavelength plate 814 is in a range of 40° to 50°, and an angle formed by the polarization axis of the linear polarizer 815 and the in-plane slow axis of the half wavelength plate 814 is in a range of −40° to −50°. Therefore, the in-plane slow axes of the two linear polarizer layers will cross necessarily at substantially right angles.

The polarization component of this embodiment can exhibit performance just as the polarization components of Second and Third Embodiments, and it is further advantageous in terms of production efficiency because the number of laminations is decreased.

An ideal operation principle in a case where a natural light beam enters the polarization component of the present embodiment will be described below, by referring to FIG. 8.

(1) First, a natural light beam 47 emitted from a backlight (light source) enters perpendicularly.
(2) The natural light beam 47 is separated by the layer 13 into a linearly polarized light beam 48 and a linearly polarized light beam 49 crossing at right angles. The linearly polarized light beam 48 passes through the layer 13, and the linearly polarized light beam 49 is reflected.
(3) When passing through the layer 14 (half wavelength plate), the linearly polarized light beam is subjected to an influence of front retardation (in-plane retardation), thereby rotating its polarization axis direction by 90° so as to become a linearly polarized light beam 50.
(4) The linearly polarized light beam 50 passes through the layer 15 (reflective linear polarizer) without changing its polarization state, and becomes a linearly polarized light beam 51.
(5) The linearly polarized light beam 51 is transmitted to an apparatus (e.g., a liquid crystal display apparatus), without losses.
(6) From the backlight, in addition to the natural light beam 47 that enters perpendicularly, a natural light beam 52 is emitted to enter obliquely.
(7) The natural light beam 52 is separated by the layer 13 (reflective linear polarizer) into a linearly polarized light beam 53 and a linearly polarized light beam 54 crossing at right angles. The linearly polarized light beam 53 passes through the layer 13, and the linearly polarized light beam 54 is reflected.
(8) The linearly polarized light beam 53 enters obliquely the layer 14 (a half wavelength plate), and passes as a linearly polarized light beam 55 through the layer 14 without changing its polarization axis direction.
(9) The linearly polarized light beam 55 is reflected by the layer 15 (reflective linear polarizer) and becomes a linearly polarized light beam 56.
(10) The linearly polarized light beam 56 enters the layer 14, passing through without changing its polarizing axis direction, and becomes a linearly polarized light beam 57.
(11) The linearly polarized light beam 57 passes through the layer 13 without changing its polarization, and becomes a linearly polarized light beam 58.
(12) The reflected light beams 49, 54 and 58 are returned to the backlight side and recycled. The recycling mechanism is the same as described in the former embodiments.

The range of angles formed by a reflective linear polarizer and a half wavelength plate is as mentioned above. Fine adjustment of the range of angles formed by the reflective linear polarizer and the half wavelength plate can be carried out according to the same concept as in the Second and Third Embodiments.

Similarly, First to Third Embodiments can be applied regarding the selective reflection wavelength band of the reflective linear polarizer.

Furthermore in this embodiment, the use efficiency of the oblique incident light beam is changed by changing the value of Nz (Formula (V)). The preferable range is not limited particularly, and it can be adjusted to obtain an optimum efficiency of light on the basis of the same concept as First to Third Embodiments. This embodiment is similar to the respective embodiments mentioned above in that the retardation of the reflective polarizer must be taken into consideration.

Though the present invention is described above regarding First to Fourth Embodiments, the present invention is not limited to the above description but can be modified variously within a range not deviating from the scope of the present invention. For example, the polarization component of the present invention can include, in addition to the respective elements as described above, any other optical layers or any other elements within the scope for achieving an object of the invention.

(Manufacturing Method and so on)

Next, a method and so on for manufacturing a polarization component of the present invention will be described. Materials and methods for manufacturing respective elements such as the C-plate, the reflective polarizer and the wavelength plate are as described above.

Though the method of manufacturing a polarization component of the present invention is not limited particularly, the polarization component can be manufactured by laminating the respective elements mentioned above and any other elements as required. Though the form of lamination is not limited particularly and the respective elements can only be superposed, the elements are preferably laminated via translucent adhesives or pressure-sensitive adhesives from aspects of the workability and efficiency of light. Though there is no specific distinction between "an adhesive" and "a pressure-sensitive adhesive" in the present invention, adhesives that can be peeled and bonded again comparatively easy is called "a pressure-sensitive adhesive" for convenience.

Though there is no particular limitation, from aspects of suppression of surface reflection and the like, it is preferable that the adhesive or the pressure-sensitive adhesive is transparent and has no absorption in the visible light range, and that the refractive index is close to those of the respective layers as much as possible. Therefore, for example, adhesives or pressure-sensitive adhesives based on acrylic, epoxy and isocyanate substances can be used preferably. These adhesives or pressure-sensitive adhesives suitably used can be a solvent type, or for example, an ultraviolet polymerization type, a thermal polymerization type, a two-liquids mixture type or the like. The method of laminating the respective elements can be selected suitably depending on the characteristics, without any particular limitations. For example, layers can be laminated in a certain order by a method of forming mono-domains separately on alignment layer or the like and transferring it to a translucent base.

For example, when the respective elements are layers containing liquid crystal compounds, it is also possible to form suitably alignment layers or the like instead of using layers of an adhesive or a pressure-sensitive adhesive, and to form directly the respective elements in a certain order (which is called 'direct and continuous coating). This method is advantageous from aspects of, for example, decreasing thickness of the polarization component. When using a reflective circular polarizer and a C-plate, since the respective elements have no optical axes within the plane and since the bonding angle can be determined arbitrarily, bonding through a roll-to-roll process and the above-mentioned direct-continuous coating can be used in a manufacturing process, therefore the productivity is improved.

The respective elements and the adhesive layer (pressure-sensitive adhesive layer) can include further various additives or the like as required. For example, particles for diffusivity adjustment can be added for providing isotropic dispersion, or surfactants or the like can be added suitably for providing a leveling property at the time of film formation. Other than that, ultraviolet absorbers or antioxidants or the like can be added suitably.

(Polarization Light Source and Image Display Apparatus)

Next, a polarization light source and an image display apparatus using a polarization component of the present invention will be described below.

A polarization light source (polarization light source apparatus) of the present invention includes a light source, a reflective layer and a polarization component of the present invention, and this polarization component is laminated on the light source via the reflective layer. Though the methods for manufacturing a polarization light source are not limited specifically, for example, a method described in JP H10(1998)-321025 A can be used.

Furthermore, an image display apparatus of the present invention is an image display apparatus including a polarization component of the present invention. Though the image display apparatus using the polarization component or the polarization light source of the present invention can be used preferably to image display apparatuses such as organic EL display apparatuses, PDPs, and CRTs without any particular limitations, it can be used particularly preferably in a liquid crystal display apparatus.

A liquid crystal display apparatus of the present invention will be described below.

A liquid crystal display apparatus of the present invention includes the polarization light source of the present invention, and a liquid crystal cell is laminated further on the polarization light source. There is no particular limitation about elements and methods of manufacturing the liquid crystal display apparatus of the present invention, and publicly known elements and manufacturing methods can be used suitably. The polarization light source of the present invention is excellent in light efficiency, and thus it can provide bright light that is excellent in perpendicularity of emitted light and free of brightness nonuniformity. Moreover, the polarization light source can be upsized. Therefore, the polarization light source can be used preferably as a backlight system in formation of various liquid crystal display apparatuses, and particularly, it can be used preferably for a direct-view type liquid crystal display apparatus.

Regarding a liquid crystal cell to be used in the liquid crystal display apparatus of the present invention, any suitable one can be used without any particular limitations. Particularly, a liquid crystal cell that allows light beams in a polarization state to enter for providing a display is used suitably. For example, liquid crystal cells using a twist nematic liquid crystal or a supertwist nematic liquid crystal are preferred. However, without being limited to these examples, liquid crystal cells that use non-twist liquid crystal, a guest-host base liquid crystal having a dichroic dye dispersed in a liquid crystal, a ferroelectric liquid crystal or the like are suitable as well. Similarly, there is no particular limitation about the system for driving the liquid crystal.

There is no particular limitation about elements other than the liquid crystal cell, and known members for a liquid crystal display apparatus can be used suitably. For example, suitable optical layers can be disposed suitably, and the optical layers include a diffusion plate, an anti-glare layer, an antireflection film, a protective layer, a protective plate, any of which will be disposed on a polarizing plate of the viewing side, and also a compensating retardation plate that will be disposed between a liquid crystal cell and a polarizing plate.

Next, an organic electroluminescence apparatus (organic EL display apparatus) will be described below.

Though the polarization component and the polarization light source of the present invention can be used for various image display apparatuses other than liquid crystal display apparatuses, they are suitable, for example, for organic EL display apparatuses. Regarding the organic EL display apparatus of the present invention, there is no specific limitation other than use of the polarization component or the polarization light source of the present invention, and publicly known configurations and manufacturing methods can be used. The following explanation about an organic EL display apparatus is not for limiting the present invention.

In general, an organic EL display apparatus has a ruminant (organic electroluminescent ruminant) that is prepared by laminating, on a transparent substrate, a transparent electrode, an organic luminant layer and a metal electrode in a certain order. Here, the organic luminant layer is a laminated body of various organic thin films. Known examples thereof include a laminate of a hole injection layer made of triphenylamine derivative(s) or the like and a luminant layer made of a fluorescent organic solid such as anthracene; a laminate of the luminant layer and an electron injection layer made of perylene derivative or the like; or a laminate of the hole injection layer, the ruminant layer and the electron injection layer.

In general, the organic EL display apparatus emits light on the principle of a system of applying a voltage to the transparent electrode and the metal electrode so as to inject holes and electrons into the organic luminant layer, energy generated by the re-bonding of these holes and electrons excites the fluorescent substance, and the excited fluorescent substance emits light when it returns to the basis state. The mechanism of the re-bonding during the process is similar to that of an ordinary diode. This implies that current and the light emitting intensity exhibit a considerable nonlinearity accompanied with a rectification with respect to the applied voltage.

It is preferred for the organic EL display apparatus that at least one of the electrodes is transparent so as to obtain luminescence at the organic luminant layer. In general, a transparent electrode of a transparent conductive material such as indium tin oxide (ITO) is used for the anode. Use of substances having small work function for the cathode is effective for facilitating the electron injection and thereby raising luminous efficiency, and in general, metal electrodes such as Mg—Ag, and Al—Li may be used.

In an organic EL display apparatus configured as described above, the organic ruminant layer is made of a film that is extremely thin such as about 10 nm.

Therefore, the organic luminant layer can transmit substantially whole light like the transparent electrode does. As a result, when the layer does not illuminate, incident light from the surface of the transparent substrate and passing through the transparent electrode and the organic ruminant layer before being reflected at the metal layer comes out again to the surface of the transparent substrate. Thereby, the display surface of the organic EL display apparatus looks like a mirror when viewed from the exterior.

As mentioned above, a typical organic EL display apparatus has an organic luminescent layer that emits light when applied with voltage, and the organic luminescent layer has a transparent electrode on the surface side and a metal electrode on the backside. The organic luminescent layer, the transparent electrode and the metal electrode are integrated to form an organic electro-luminant. In such an organic EL display apparatus, a polarizing plate can be disposed on the surface side of the transparent electrode and at the same time, a retardation plate can be disposed between the transparent electrode and the polarizing plate.

The retardation plate and the polarizing plate function to polarize light which enters from outside and is reflected by the metal electrode, and thus the polarization has an effect that the mirror of the metal electrode cannot be viewed from exterior. Particularly, the mirror of the metal electrode can be blocked completely by forming the retardation plate with a quarter wavelength plate and adjusting an angle formed by the polarization directions of the retardation plate and the polarizing plate to be $\pi/4$.

That is, the polarizing plate transmits only the linearly polarized light element among the external light entering the organic EL display apparatus. In general, the linearly polarized light is changed into elliptically polarized light by the retardation plate. When the retardation plate is a quarter wavelength plate and when the angle of the polarization directions of the polarizing plate and the retardation plate is $\pi/4$, the light is changed into circularly polarized light.

Generally, this circularly polarized light passes through the transparent substrate, the transparent electrode, and the organic thin film. After being reflected by the metal electrode, the light passes again through the organic thin film, the transparent electrode and the transparent substrate, and turns into linearly polarized light at the retardation plate. Moreover, since the linearly polarized light crosses the polarization direction of the polarizing plate at right angles, it cannot pass through the polarizing plate. As a result, the mirror of the metal electrode can be blocked completely.

Though a polarization light source and an image display apparatus using a polarization component of the present invention have been described above, the present invention is not limited to the description. The polarization component of the present invention, using a reflective polarizer and a retardation layer that satisfy the requirements of the present invention, can exhibit effects of transmitting front direction light only while reflecting and eliminating light in the oblique direction. Furthermore, by adjusting a selective reflection wavelength band of the reflective polarizer, the effects can be exhibited in a wide wavelength range with less wavelength dependency. Moreover, since dependency on the characteristics of a light source is decreased in comparison with parallelization and focusing system provided by combination of an interference filter and a bright line emission light source as in a conventional technique, it can be used for various kinds of polarization light sources and image display apparatuses.

EXAMPLES

The following is a further description of the present invention, with reference to Examples and Comparative Examples. It should be noted that the present invention is not limited to these Examples alone.

(Instruments)

Equipment used in Examples and Comparative Examples will be described below. Cold cathode ray tubes (CCFL) were products of Elevam Corporation. Backlights were products of Stanley Electric Co., Ltd. and of Tama Electric Co., Ltd. Light tables were products of HAKUBA.

The measurement apparatuses used were as follows.
(1) For measurement of a selective reflection wavelength band, an instant multiple photometry system (trade name: MCPD 2000 produced by Otsuka Electronics Co., Ltd.) was used.
(2) For haze measurement, a haze meter (trade name: HM 150 produced by Murakami Color Research Laboratory) was used.
(3) For measurement of spectral characteristics in transmission/reflection, a spectrophotometer (trade name: U4100 produced by Hitachi, Ltd.) was used.
(4) For measurement of characteristics of a polarizing plate, DOT 3 (trade name) produced by Murakami Color Research Laboratory was used.
(5) For measurement of retardation of a retardation plate or the like, a birefringence measuring apparatus (trade name: KOBRA 21D produced by Oji Scientific Instruments) was used.
(6) For measurement of brightness, a brightness photometer (trade name: BM7 produced by Topcon Corporation) was used.

Example 1

A polarization component including a reflective circular polarizer and a negative C-plate was produced as described below, and the characteristics were measured.

First, a reflective polarizer (reflective circular polarizer) including a cholesteric liquid crystal layer was produced by using a commercially-available polymerizable nematic liquid crystal polymer (polymerizable mesogenic compound) and a chiral agent. The types and mixing ratios were determined so that the thus obtained cholesteric liquid crystal layer would have a selective reflection wavelength band whose central value was 550 nm and whose width was about 60 nm. Specifically, LC 242 (trade name) produced by BASF was used for the polymerizable mesogenic compound and LC 756 (trade name) produced by BASF was used for the polymerizable chiral agent, where the mixing ratio was as follows.

Mesogenic compound: chiral agent=4.9:95.1 (weight ratio)

Specifically, the reflective circular polarizer is produced through the following operations. First, a mixture of the polymerizable chiral agent and the polymerizable mesogenic compound was dissolved in cyclopentane, which was then adjusted to have a solute consistency of 20 wt %. To this solution, 1 wt % of an initiating reagent (trade name: Irg 907 produced by Chiba-Geigy Co., Ltd.) was added so as to prepare a coating solution.

A PET film (trade name: Lumirror produced by Toray Industries) having a thickness of 75 µm was prepared, whose surface was treated with a rubbing cloth for alignment, thereby providing an alignment substrate. Next, on the treated surface of the alignment substrate, the coating solution was applied by using a wire bar. At this time, the amount of the solution was adjusted so that the thickness of the coating would be 5 µm after being dried. This was then dried at 90° C. for 2 minutes, and further heated once to 130° C. as an isotropic transition temperature of the liquid crystal, then slowly cooled to retain a uniform alignment state. By curing this with ultraviolet irradiation at 80° C. (10 mW/cm$^2$×1 min.), a reflective polarizer A including a cholesteric liquid crystal compound was obtained. A glass plate was prepared, on which a translucent isocyanate-based adhesive (trade name:AD 249 produced by Tokushiki Co., Ltd.) was coated to have a thickness of 5 µm, and the reflective polarizer A was transferred thereon, so that a desired reflective circular polarizer was obtained. In a measurement, this reflective circular polarizer had a selective reflection wavelength band of 520 nm to 580 nm as had been designed.

Next, a negative C-plate including a polymeric liquid crystal compound was produced so that the central value of the cholesteric selective reflection wavelength band would be 350 nm. Specifically, LC242 (trade name) produced by BASF and LC 756 (trade name) produced by BASF were used for the polymerizable mesogenic compound and for the polymerizable chiral agent, where the mixing ratio was as follows.

Mesogenic compound: chiral agent=11.0:88.0 (weight ratio)

Specifically, the negative C-plate is produced by the following operations. First, the mixture of the polymerizable chiral agent and the polymerizable mesogenic compound was dissolved in cyclopentane, which was adjusted to have a solute consistency of 30 wt %. To this solution, 1 wt % of an initiating reagent (trade name: Irg 907 produced by Ciba-Geigy Co., Ltd.) and 0.013 wt % of a surfactant (trade name: BYK-361 produced by BYK-Chemie Japan) were added.

A PET film (trade name: Lumirror produced by Toray Industries) having a thickness of 75 µm was prepared, whose surface was treated with a rubbing cloth for alignment, thereby providing an alignment substrate. Next, on the treated surface of the alignment substrate, the coating solution was applied by using a wire bar. At this time, the amount of the solution was adjusted so that the thickness of the coating would be 6 µm after being dried. This was then dried at 90° C. for 2 minutes, and further heated once to 130° C. as an isotropic transition temperature of the liquid crystal, then slowly cooled to retain a uniform alignment state. By curing this with ultraviolet irradiation at 80° C. (10 mW/cm$^2$×1 min.), a laminate including the desired negative C-plate including the cholesteric liquid crystal and being formed on the alignment substrate was obtained.

In a measurement, the negative C-plate had retardation of 2 nm (substantially can be considered as 0) in the front direction (in-plane retardation) with respect to a light beam having a wavelength of 550 nm. The retardation was 160 nm (>λ/8) along a direction at 30° inclination.

The thus obtained reflective circular polarizer and the negative C-plate were used to produce a polarization component. First, the reflective circular polarizer including a reflective circular polarizer A formed on a glass plate was prepared. Next, the negative C-plate was transferred onto the reflective circular polarizer A. More specifically, a translucent adhesive (trade name:AD249 produced by Tokushiki Co., Ltd.) was applied to have a thickness of 5 µm on the reflective circular polarizer A, to which the negative C-plate formed on the alignment substrate (PET film) was adhered. Then, the alignment substrate was peeled off to leave the negative C-plate alone. On the negative C-plate, another reflective circular polarizer A was transferred further in the same manner, thereby obtaining a desired polarization component. This polarization component includes, on a glass plate, a first reflective circular polarizer A, a negative C-plate and a second reflective circular polarizer A laminated in this order, and the respective layers are adhered via adhesive layers.

Next, performance of the obtained polarization component was evaluated. First, the polarization component was combined with a green diffusion light source having a bright line spectrum in 544 nm so as to produce a polarization light source. Specifically, a G0 type cold cathode ray tube produced by Elevam Corporation and a light-scattering plate (haze: at least 90%) were combined to provide a diffusion light source, with which the polarization component was further combined to provide a polarization light source, and this was disposed inside a direct-type backlight apparatus. The light diffusion plate was disposed between the polarization component and the cold cathode ray tube.

Figure 16:
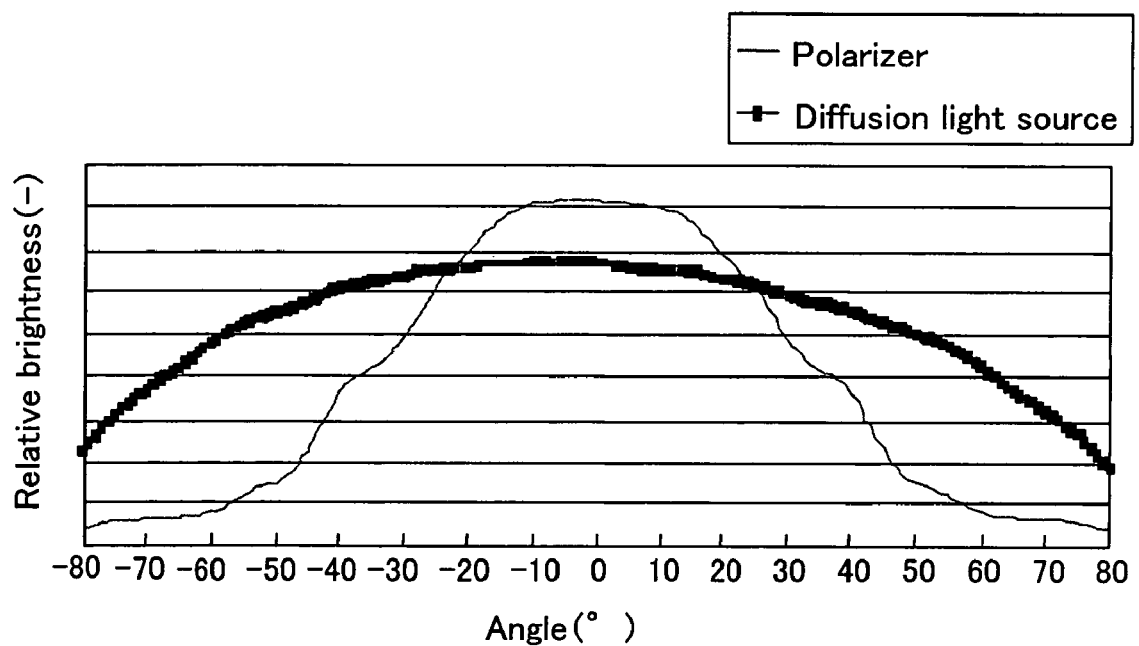
FIG. 16 is a graph to show performance in focusing and brightness enhancement for a polarization component of Example 1.

In an inspection of the characteristics of the polarization light source, light beams are emitted in the normal direction, but transmitted light beams are decreased when the oblique angle is 30° or more, and substantially no light beams are emitted when the oblique angle is approximately 45°. FIG. 16 shows a relationship between an emission angle and a relative brightness for each case where the diffusion light source is used alone and where the polarization component of the present example was combined to provide a polarization light source.

FIG. 16 shows that the polarization component of the present example can focus light beams efficiently in the front direction. This can be considered as a characteristic of the polarization component, since generally it is considered as difficult to focus light beams in the front direction by a lens or a prism in a direct-type backlight, unlike a case of sidelight-type backlight.

Next, the polarization component of the present example was disposed on a backlight (sidelight-wedge type backlight produced by Stanley Electric Co., Ltd.) including three-wavelength cold cathode ray tube and used for a liquid crystal display apparatus, thereby the characteristics were evaluated. Similarly in this case, light beams were emitted in the normal direction, but transmitted light beams were decreased when the oblique angle was 30° or more. Since the polarization component did not correspond to the entire range of the visible light, light beams of blue (435 nm) and red (610 nm) were leaked due to incomplete stop-down of angles, but a green spectrum (545 nm) with the highest visibility can be eliminated. As a result, operation as a focusing apparatus was confirmed.

Example 2

A polarization component was produced in the same manner as Example 1 except for using a positive C-plate in place of the negative C-plate. First, a positive C-plate containing a polymeric liquid crystal compound was produced by using a liquid crystal monomer (referred to as a polymerizable nematic monomer A) represented by the following formula.

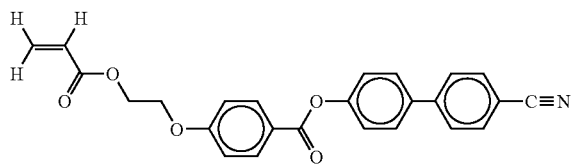

Specific operations for producing the positive C-plate are as follows. First, a polymeric nematic monomer A was dissolved in cyclopentane and adjusted to have a solute consistency of 30 wt %. Further, 1 wt % of an initiating reagent (trade name: Irg907 produced by Ciba-Geigy Co., Ltd.) was added to this solution so as to provide a coating solution. A PET film (trade name: Lumirror, produced by Toray Industries, thickness: 75 μm) was prepared, on which a light coating of a cyclohexane solution (0.1 wt %) of a release agent (octadecyl trimethoxysilane) was formed, which was then dried to form a perpendicularly-aligned film, thereby an alignment substrate was formed. On the surface of this alignment substrate on which the perpendicularly-aligned film was formed, the above-mentioned coating solution was coated by using a wire bar. At this time, the amount of the coating solution was adjusted so that the thickness of the film would be 2 μm after being dried. This was then dried for 2 minutes at 90° C., once heated to 130° C. as an isotropic transition point of the liquid crystal, then slowly cooled to retain a uniform alignment state. Then, it was cured by irradiation of ultraviolet ray at 80° C. (10 mW/cm$^2$×1 min.), thereby a laminate having a desired positive C-plate formed on the alignment substrate was formed. In a measurement, the retardation of this positive C-plate with respect to a light beam having a wavelength of 550 nm was 0 nm in the front direction, and the retardation was about 170 nm (>λ/8) in a measurement with an inclination of 30°.

A polarization component was obtained in the same manner as Example 1 except that this positive C-plate was used in place of the negative C-plate of Example 1. In an evaluation by using the thus obtained polarization component as in Example 1, the results for the performance were substantially the same as those of Example 1.

Example 3

A polarization component including a reflective linear polarizer, a quarter wavelength plate and a C-plate was produced as described below and its performance was evaluated.

First, a reflective linear polarizer was produced. That is, polyethylene naphthalate (PEN) and naphthalene dicarboxylic acid-terephthalic acid copolyester (co-PEN) were laminated alternately while adjusting the thickness of the thin films by a feed-block method, thereby obtaining a multilayer film of 20 layers. Then, this multilayer film was stretched uniaxially. At this stretching, the temperature was about 140° C., and the stretching ratio was about 3 in the TD direction. In the thus obtained stretch film, each thin film had a thickness of about 0.1 μm. Five laminate films of this kind of film including 20 layers were laminated so that the product including 100 layers in total was provided, thereby a desired reflective linear polarizer (reflective polarizer B) was obtained. Due to the entire reflection power, the reflective polarizer B had a reflection function with respect to linearly polarized light in a wavelength band not lower than 500 nm and not higher than 600 nm.

Further, a polarization component was produced, using the reflective polarizer B. That is, a negative C-plate was produced as in Example 1, and to the both surfaces, a quarter wavelength plate (trade name: NRF film produced by Nitto Denko Corporation, having retardation (in-plane retardation) of 135 nm at 550 nm) made of a uniaxially stretched film of polycarbonate were adhered, and furthermore, the reflective polarizers B were adhered to the outermost surfaces so as to obtain a desired polarization component. The respective layers were bonded so that the in-plane slow axis direction of the quarter wavelength plate at the incidence side would be 45°, the C-plate had no axial direction, the in-plane slow axis direction of the quarter wavelength plate at the emission side would be −45°, and the transmission polarization axis direction of the polarizer at the emission side would be 90°, when the transmission polarization axis direction of the reflective polarizer B at the incidence side was 0°. The respective layers were adhered by applying an acrylic pressure-sensitive adhesive (No. 7 produced by Nitto Denko Corporation) 25 μm in thickness, and the alignment substrate was peeled off from the negative C-plate in order to use the liquid crystal containing layers alone. In an evaluation, the thus obtained polarization component used in substantially same manner as Example 1 exhibited substantially the equal performance as Example 1.

Example 4

A polarization component including a reflective linear polarizer and a half wavelength plate was produced as described below, and its performance was evaluated. First, two reflective polarizers B produced in the same manner as Example 3, and a retardation film (a half wavelength plate) obtained by biaxially stretching a polycarbonate film (produced by KANEKA Corporation) and having a front retardation of 270 nm (measured wavelength: 550 nm) and having a Nz coefficient of 2.0 were prepared. Then, the half wavelength plate was sandwiched by the two reflective polarizers B so as to adhere these layers and obtain a desired polarization component. Regarding the bonding angles for respective layers, when the transmission polarization axis direction of the reflective polarizer B at the incidence side was 0°, the in-plane slow axis direction of the half wavelength plate would be 45°, and the transmission polarization axis direction of the polarizer at the emission side would be 90°. The respective layers were adhered by applying an acrylic pressure-sensitive adhesive (No. 7 produced by Nitto Denko Corporation) to have a thickness of 25 μm between respective layers. In an evaluation similar to that of Example 3, the polarization component was found to have performance substantially equal to that of Example 3.

Example 5

A reflective circular polarizer (wide-band reflective circular polarizer) having a selective reflection wavelength band in a wide wavelength region was manufactured as described below. It was used with a C-plate in order to produce a polarization component, and its performance was evaluated.

First, a wide-band reflective circular polarizer was manufactured. That is, a nematic monomer A (as described above) and a chiral monomer B represented by the structural formulae below were prepared.

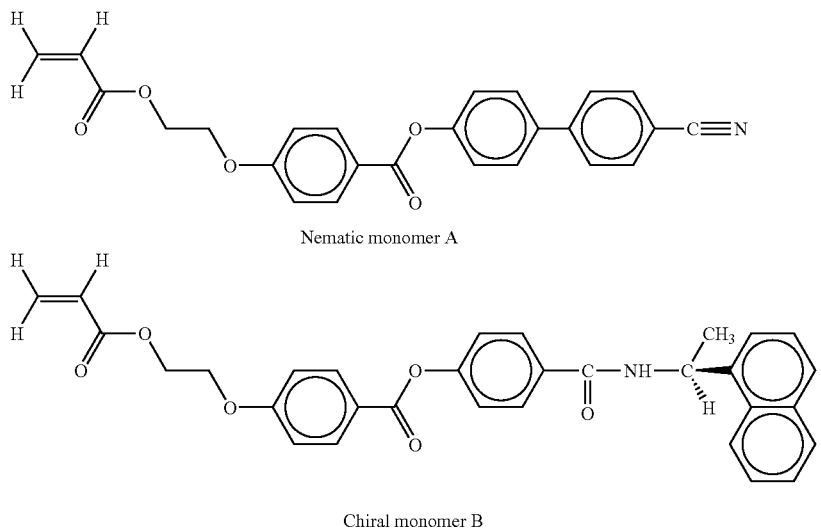

Nematic monomer A

Chiral monomer B

Next, the nematic monomer A and the chiral monomer B were mixed at a predetermined ratio and polymerized, which was used to produce a cholesteric liquid crystal layer. Further, by changing the mixing ratio of the nematic monomer A to the chiral monomer B, four cholesteric liquid crystal layers having varied selective reflection wavelength bands were produced. In the production, EP Application 0834754 was referred to. The specific description is as follows.

Table 1 below shows a ratio for mixing the nematic monomer A and the chiral monomer B (weight ratio), and selective reflection wavelength bands and the central wavelengths of the respective cholesteric layers, which are calculated therefrom.

TABLE 1

| A/B | Selective reflection wavelength band | Central wavelength |
|---|---|---|
| 9.2/1 | 430-490 nm | 460 nm |
| 10.7/1 | 480-550 nm | 510 nm |
| 12.8/1 | 540-620 nm | 580 nm |
| 14.9/1 | 620-710 nm | 660 nm |

Next, the nematic monomer A and the chiral monomer B were polymerized to synthesize a cholesteric liquid crystal compound. That is, each of the mixtures of the composition as shown in Table 1 was dissolved in tetrahydrofuran to prepare a 33 wt % solution, to which 0.5 wt % of an initiating reagent (azobisisobutyronitrile) was added further. This was subjected to a nitrogen-purge at 60° C., and then polymerized in a usual manner. The thus obtained product was reprecipitate-separated with diethyl ether and refined to obtain a desired cholesteric liquid crystal compound.

A triacetylcellulose (TAC) film (trade name: TD-TAC produced by Fuji Photo Film Co., Ltd.) 80 μm in thickness was prepared, on which a polyimide layer having a thickness of about 0.1 μm was applied, and the polyimide layer surface was rubbed with a rayon rubbing cloth so as to provide an alignment substrate. Next, on the rubbed surface, a 10 wt % methylene chloride solution of the cholesteric liquid crystal compound was coated by using a wire bar so that the coated film would have a thickness of 1.5 μm after being dried. This was heated at 140° C. for 15 minutes, and subsequently kept and cooled at room temperature so as to fix the alignment state of the cholesteric liquid crystal compound, thereby obtaining a cholesteric liquid crystal layer. The above-mentioned operations were carried out for each of the thus synthesized cholesteric liquid crystal compounds so as to obtain cholesteric liquid crystal layers respectively having the selective reflection wavelength bands as shown in Table 1.

The thus obtained four cholesteric liquid crystal layers were adhered in a certain order from the short wavelength side so as to obtain a liquid crystal composite layer having a thickness of about 10 μm, thereby forming a desired wideband reflective circular polarizer. The adhesion was carried out by applying a transparent isocyanate-based adhesive (trade name: AD244 produced by Tokushiki Co., Ltd.) on a surface of each liquid crystal layer, and subsequently peeling off the alignment substrate (TAC film) of one side. In a measurement, the thus obtained wide-band reflective circular polarizer had a selective reflection function in a range of 430 nm to 710 nm.

A C-plate was produced in the same manner as Example 1, and the wide-band reflective circular polarizers were adhered on the both surfaces so as to obtain a desired polarization component. For the adhesion, a transparent pressure-sensitive adhesive (No. 7 produced by Nitto Denko Corporation) 25 μm in thickness was applied between the respective layers, and the operations as in Example 1 were carried out. The upper and lower reflective circular polarizers were disposed so that the passing (reflected) circularly polarized light beams would rotate in the same direction.

Next, performance of the polarization component of this Example was evaluated as in Example 1. In an evaluation using a green diffusion light source, a focusing performance similar to that of the polarization component of Example 1 was confirmed. In an evaluation using a backlight for a liquid crystal display apparatus having a three-wavelength cold cathode ray tube, the focusing performance in this Example was as good as that in Example 1. The polarization component of this Example was excellent in comparison with Example 1, in that the focusing performance of the same level was exhibited in the entire visible light region.

Furthermore, the polarization component of this Example was disposed on another backlight (a direct-type backlight using a cold cathode ray tube, produced by Tama Electric Co., Ltd.), and the focusing performance was evaluated. Similarly in this case, light beams were emitted in the normal direction, but the transmitted light beams were decreased at an oblique angle of 30° or more. As a result, similar focusing performance was exhibited in the entire visible light region.

Example 6

A polarization component was produced in the same manner as Example 5 except that the thickness and retardation value of the C-plate was changed, and the focusing performance was evaluated as in Example 5. In a measurement of this Example, the C-plate had a thickness of 4 μm, and the front retardation was 1 nm, the retardation at inclination of 30° was 100 nm (>λ/8).

FIG. 16 shows a relationship between an emission angle and relative brightness of an emitted light beam for each case of using a polarization light source prepared by combining each of the polarization components in Examples 5 and 6 with a diffusion light source, and a case of using the diffusion light source alone. This figure shows that though any of the polarization components exhibits excellent focusing performance, the polarization component of Example 5 has a sharper focusing angle and greater rise in the front brightness.

Example 7

The polarization component of Example 5 was assembled in a liquid crystal display apparatus, and the display performance was evaluated. Specific description is as follows. First, for the liquid display apparatus, a TFT liquid crystal display apparatus (diagonal: 11.3 inches) taken from Dynabook SS3430 (trade name) produced by Toshiba Corporation was prepared. This apparatus uses a light source of a sidelight type light-guide, and focus light beams to the front by means of a prism sheet. Next, the prism sheet was removed from this liquid crystal display apparatus, and onto a polarizer at the backside of the apparatus, a quarter wavelength plate (trade name: NRF-140 produced by Nitto Denko Corporation) was adhered at an angle of 45° with respect to the polarization axis, and furthermore, the polarization component obtained in Example 5 was adhered to the surface. For the adhesion, a translucent pressure-sensitive adhesive (No. 7 produced by Nitto Denko Corporation) 25 μm in thickness was applied. In this manner, a commercially-available liquid crystal display apparatus was processed to obtain a desired liquid crystal display apparatus in which the polarization component of Example 5 was assembled. In a comparison in performance between the thus obtained liquid crystal display apparatus with the polarization component and an unprocessed liquid crystal display apparatus using a prism sheet, the property for focusing toward the front was substantially equal to the display apparatus using a prism sheet, and the front brightness was improved by 20% after the processing. This result demonstrates that the polarization component of the present invention is superior to conventional techniques such as a prism sheet.

Comparative Example 1

A polarization component was produced in the same manner as Example 1 except that two reflective circular polarizer layers were bonded directly to each other without using a C-plate. In an evaluation for the performance of this polarization component, the optical functions were restricted to the same level as that of a single reflective circular polarizer layer, while no phenomena such as improvement in selective reflection rate and degradation in transmittance in an oblique direction was observed.

Comparative Example 2

A polarization component was produced in the same manner as Example 1 except that a quarter wavelength plate was used in place of the C-plate. The quarter wavelength plate used was an A-plate (trade name: NRF-140 film produced by Nitto Denko Corporation, thickness: 50 μm) made of a stretched polycarbonate film having a front retardation of λ/4 and Nz coefficient=1.0. In an evaluation of the thus obtained polarization component, the front transmission was decreased by about ½ in comparison with Example 1. In addition, the transmittance in the oblique incidence direction was not decreased, and the polarization component did not exhibit focusing and light parallelizing functions.

Comparative Example 3

A polarization component was obtained in the same manner as Example 3 except that a commercially-available iodine-based absorptive dichroic polarizer (trade name: NPF-EG1425DU produced by Nitto Denko Corporation) was used in place of the reflective polarizer B. In an evaluation of this polarization component, an effect of restricting visibility angle was obtained due to the transmission characteristic in the front direction and absorption characteristic in the oblique direction, but the front brightness was not improved due to the considerable absorption loss.

(Brightness Evaluation by use of A Light Table)

Each of the polarization components in Examples 1-6 and Comparative Examples 1-3 was disposed on a commercially-available light table (a product of HAKUBA, three-wavelength fluorescent lamp, direct-type diffusion light source), and the brightness in the perpendicular rise (2° visibility angle) was measured by using a brightness photometer (trade name: BM7 produced by Topcon Corporation). The measurement value was normalized by setting a value measured by using a light table alone as 100. The measurement results are shown in Table 2.

TABLE 2

|  | Relative brightness |
| --- | --- |
| Example 1 | 80 |
| Example 2 | 78 |
| Example 3 | 72 |
| Example 4 | 70 |
| Example 5 | 82 |
| Example 6 | 90 |
| Comparative Example 1 | 67 |
| Comparative Example 2 | 21 |
| Comparative Example 3 | 39 |

Figure 17:
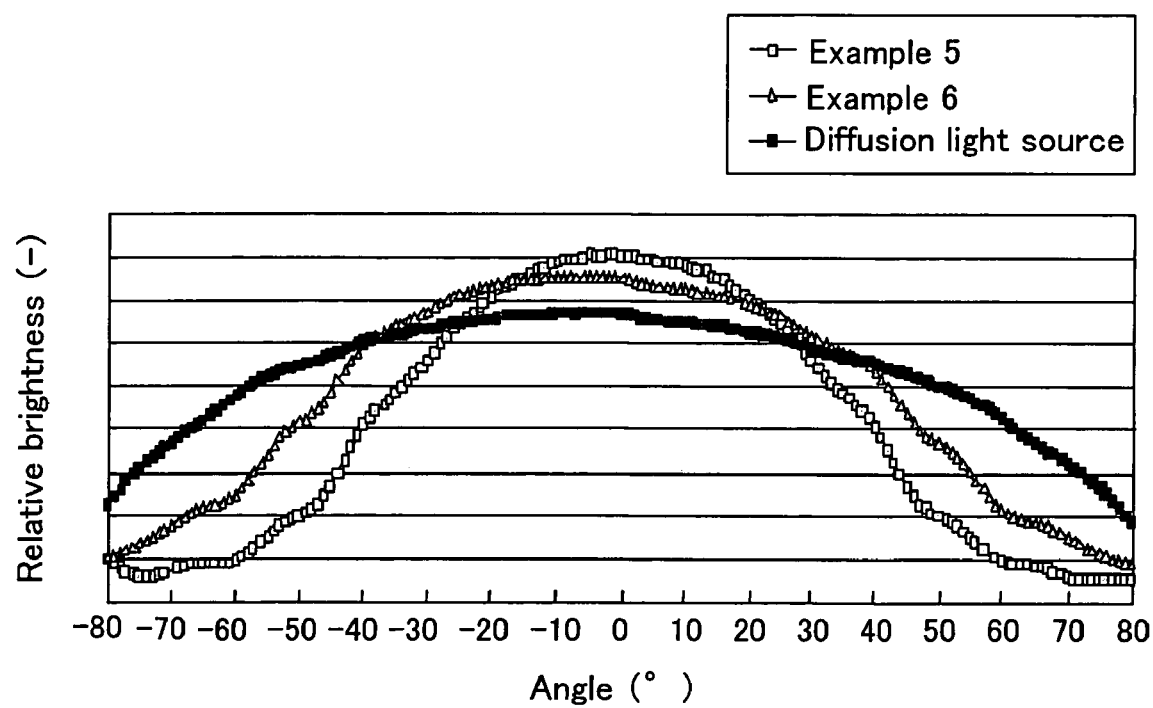
FIG. 17 is a graph to show performance in focusing and brightness enhancement for polarization components of Examples 5 and 6.
Figure 18:
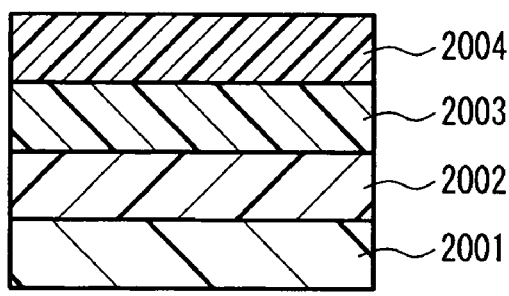
FIG. 18 shows an example of a polarizing element further including another layer having a function of a quarter wavelength plate.
Figure 19:
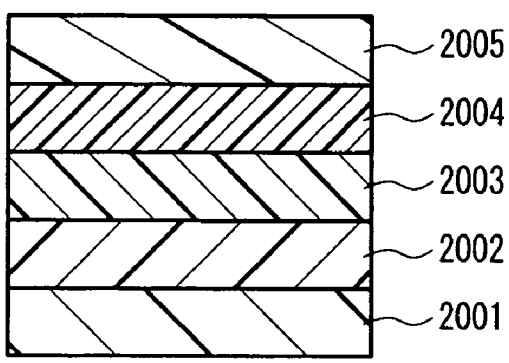
FIG. 19 shows an example of a polarizing element further including another layer having a function of a quarter wavelength, plate and an absorptive dichroic polarizing plate.
Figure 20:
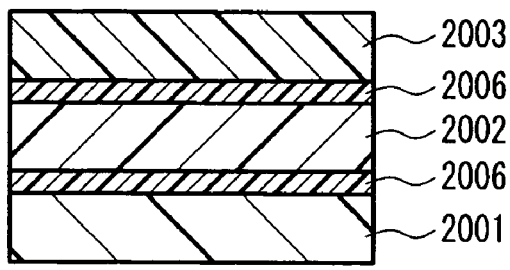
FIG. 20 shows an example of a polarizing element laminated via a layer of a translucent adhesive or pressure-sensitive adhesive. Numeral 2001 denotes a reflective circular polarizer, 2002 denotes a retardation layer, 2003 denotes a reflective circular polarizer, and 2006 denotes a translucent adhesive.

As indicated in Table 2, the polarization components of Examples exhibited excellent brightness enhancement effects in front directions even when they were used for light tables. As shown in FIGS. 16 and 17, though the front relative brightness of the polarization component in each Example exceeded 100 (the front brightness of the original backlight) in a use for a direct-type backlight used for a liquid crystal display apparatus, the relative brightness was slightly lower than 100 in Table 2, since, for such a commercially-available light table, efficiency for a light beam reflected by a reflective polarizer to return in the normal direction is slightly inferior in comparison the case where the direct-type backlight is used. Still, it is shown that the polarization component of each Example has a particularly excellent effect in enhancing brightness in the front direction, as compared to a polarization component in each Comparative Example.

INDUSTRIAL APPLICABILITY

As mentioned above, a polarization component of the present invention can reflect an obliquely transmitted light beam toward a light source effectively without degrading the transmission-polarization property of a perpendicular incident light beam that contributes to front brightness. Furthermore, it is possible to further enhance the brightness by converting an obliquely transmitted light beam reflected toward the light source (i.e., reflected polarized light) into a light beam that can contribute to enhancement of the front brightness. Also, by adjusting the selective reflection wavelength band of the reflective polarizer, the effects can be exhibited in a wide wavelength range with less wavelength dependency. Furthermore, since the polarization component of the present invention is less dependent on the characteristics of the light source, as compared to a light-parallelizing and focusing system or the like provided by combination of an interference filter and a bright-line spectrum light source as in a conventional technique, it can be used for various polarization light sources and image display apparatuses. For example, when it is used as a polarizer at the backlight side of a liquid crystal display component, a bright display that is excellent in visibility can be obtained. Moreover, due to the excellent efficiency in using diffused light emitted from a light source, it can be used for forming a high-brightness polarization light source apparatus, and image display apparatuses such as an organic EL display apparatus, PDP and CRT.

What is claimed is:

1. A polarization component comprising at least two reflective polarizer layers and a retardation layer disposed between the reflective polarizer layers, wherein
the two reflective polarizer layers are reflective circular polarizer layers that selectively transmit one of clockwise circularly polarized light or counterclockwise circularly polarized light while selectively reflecting the other, wherein
the two reflective circular polarizer layers have selective reflection wavelength bands for selective reflection of polarized light, the bands overlapping each other at least partially, and
the retardation layer satisfies conditions of Formulae (I) and (II) below:

$$R \leq \lambda/10 \quad (I)$$

$$R' \geq \lambda/8 \quad (II)$$

wherein in Formulae (I) and (II), $\lambda$ denotes a wavelength of light entering the retardation layer;
R denotes an absolute value of retardation of an in-plane retardation in a X-axis direction and in a Y-axis direction with respect to incident light from a Z-axis direction (normal direction), where the X-axis direction is a direction showing a maximum refractive index within the plane of the retardation layer (in-plane slow axis direction), the Y-axis direction is a direction perpendicular to the X-axis direction within the plane of the retardation layer (in-plane fast axis direction), and the Z-axis direction is a thickness direction of the retardation layer and perpendicular to the X-axis direction and the Y-axis direction;
R' denotes an absolute value of retardation between a X'-axis direction and a Y'-axis direction with respect to incident light from a direction inclined by at least 30° with respect to the Z-axis direction, where the X'-axis direction is an axial direction within a plane of the retardation layer perpendicular to the incidence direction of the incident light inclined by at least 30° with respect to the Z-axis direction, and the Y'-axis direction is a direction perpendicular to the incidence direction and to the X'-axis direction.

2. The polarization component according to claim 1, wherein circularly polarized light beams passing through the two reflective circular polarizer layers rotate in a same direction.

3. The polarization component according to claim 1, wherein an overlapping region of the selective reflection wavelength bands in the two reflective circular polarizer layers comprises a wavelength range of 540 to 560 nm.

4. The polarization component according to claim 1, wherein the retardation layer comprises a cholesteric liquid crystal compound fixed in a planar alignment state, and a selective reflection wavelength band of the retardation layer is present in a wavelength region other than a visible light region of 380 nm to 780 nm.

5. The polarization component according to claim 1, wherein the retardation layer comprises a rodlike liquid crystal compound fixed in a homeotropic alignment state.

6. The polarization component according to claim 1, wherein the retardation layer comprises a discotic liquid crystal compound fixed in a nematic phase or columnar phase alignment state.

7. The polarization component according to claim 1, wherein the retardation layer comprises a biaxially-aligned non-liquid crystal polymer.

8. The polarization component according to claim 1, wherein the retardation layer comprises an inorganic layered compound having a negative uniaxiality, the inorganic layered compound is in an alignment state where an optical axis direction of the retardation layer is fixed in a direction (normal direction) perpendicular to the plane.

9. The polarization component according to claim 1, the polarization component further comprising at least one additional layer having a function of a quarter wavelength plate at least in a front direction, the layer is disposed outside of at least one of the two reflective circular polarizer layers and positioned at the visible side.

10. The polarization component according to claim 9, the polarization component further comprising an absorptive dichroic polarizing plate, the absorptive dichroic polarizing plate is disposed outside the additional layer having a function of a quarter wavelength plate at least in the front direction.

11. The polarization component according to claim 1, wherein the respective layers are laminated through translucent layers of an adhesive or a pressure-sensitive adhesive.

12. An image display apparatus comprising a polarization component according to claim 1.

* * * * *